United States Patent [19]

Keys et al.

[11] Patent Number: 4,950,567
[45] Date of Patent: Aug. 21, 1990

[54] HOLOGRAPHIC OPTICAL COMBINERS FOR HEAD-UP DISPLAYS

[75] Inventors: Dalen E. Keys, Wilmington; William K. Smothers, Hockessin; Albert F. Harrington, Claymont; Jacob Beutel, Hockessin, all of Del.; Scott R. Schicker, Logan, Utah; Dillon F. Scofield, Newark, Del.

[73] Assignee: E. I. du Pont de Nemours and Company, Wilmington, Del.

[21] Appl. No.: 370,275

[22] Filed: Jun. 22, 1989

Related U.S. Application Data

[63] Continuation-in-part of Ser. No. 144,840, Jan. 15, 1988, abandoned.

[51] Int. Cl.[5] .................. G03H 1/04; G03H 1/06
[52] U.S. Cl. ............................................. 430/1; 430/2;
430/281; 430/912; 350/3.6; 350/3.61; 350/3.65
[58] Field of Search ............ 430/1, 2, 281, 290,
430/912; 350/3.61, 3.6, 3.65, 3.7

[56] References Cited

U.S. PATENT DOCUMENTS

| | | | |
|---|---|---|---|
| 3,658,526 | 4/1972 | Haugh | 430/1 |
| 3,809,732 | 5/1974 | Chandross et al. | 430/1 |
| 3,940,204 | 2/1976 | Withrington | 350/3.72 |
| 3,993,485 | 11/1976 | Chandross et al. | 40/1 |
| 4,173,474 | 11/1979 | Tanaka et al. | 430/1 |
| 4,535,041 | 8/1985 | Fielding et al. | 430/1 |
| 4,588,664 | 5/1986 | Fielding et al. | 430/1 |
| 4,687,720 | 8/1987 | Wreede et al. | 430/2 |
| 4,696,876 | 9/1987 | Cael | 430/1 |
| 4,766,055 | 8/1988 | Kawabata et al. | 430/281 |
| 4,799,746 | 1/1989 | Wreede | 350/3.6 |

OTHER PUBLICATIONS

Wopschall et al., "Dry Photopolymer Film for Recording Holograms," Applied Optics, vol. 11, No. 9, 9/72, pp. 2096–2097.

W. C. Hay and B. D. Guenther, "Characterization of Polaroid's DMP-128 Holographic Recording Photopolymer", SPIE vol. 883 *Holographic Optics: Design and Applications* (1988), pp. 102–105.

R. T. Ingwall and M. Troll, "The Mechanism of Hologram Formation in DMP-128 Phtopolymer", SPIE vol. 883 *Holographic Optics: Design and Applications* (1988), pp. 94–101.

*Primary Examiner*—Paul R. Michl
*Assistant Examiner*—Patrick A. Doody

[57] ABSTRACT

Optical Combiners are provided for use in Head-Up Displays. The Combiners have a refractive index modulation greater than approximately 0.001.

30 Claims, 2 Drawing Sheets

HOLOGRAPHIC OPTICAL COMBINERS FOR HEAD-UP DISPLAYS

CROSS REFERENCE TO RELATED APPLICATIONS

This application is a continuation-in-part of Ser. No. 07/144,840, Process of Forming Reflection Holograms in Photopolymerizable Layers, filed Jan. 15, 1988 now abandoned.

FIELD OF THE INVENTION

This invention relates to Head-Up Displays (HUDs) and, more particularly, to improved holographic optical combiners that employ a photopolymer film imaged to contain a reflection hologram that functions by diffracting light.

DISCUSSION OF THE BACKGROUND AND PRIOR ART

HUDs are used to display information on the windshield of a vehicle, such as an aircraft or automobile, in order that the person controlling the vehicle has ready access to the information without the need to divert attention to an instrument panel. The desired information is optically projected onto the windshield, where it is reflected into the viewer's line of sight. In other applications, the information may be projected onto a transparent screen between the operator and the windshield, or onto a visor worn by the operator (e.g., a pilot), and then reflected to the operator. Thus, the operator has immediate access to the information while continuing to view the path of the vehicle.

The element used to reflect the information to the operator is commonly referred to as an "Optical Combiner" or, more simply, as a Combiner.

To be effective, the Combiner must have several properties. First, it must selectively reflect only a narrow band of light and be transparent to other wavelengths. Thus, information projected onto the windshield will be reflected to the operator while other wavelengths pass through the Combiner, enabling the operator to view the path of the vehicle. Secondly, it is desirable that the Combiner have a high reflection efficiency for the light band used to display information in order that the information can be easily observed.

Combiners are generally made by recording a refractive index image in a transparent film element, using the technique for forming reflection holograms generally described in U.S. Pat. No. 3,532,406 ("Hartman"). The imaged film is then laminated into or onto the windshield in HUD applications. In the method described by Hartman, also known as the "off-axis" method of forming reflection holograms, a beam of coherent light is split into two beams that are projected onto opposite sides of the film element. If the two beams enter the film element essentially normal to its plane, interference fringes will be formed within the element that are substantially parallel to its plane. Alternatively, if the two beams enter the element at different angles, the interference fringes will be formed at an angle to that of the plane (i.e., the fringes will be "slanted"). In either case the interference fringes are formed from a modulation in refractive index and thus diffract light having a wavelength determined by spacing of the fringes.

Dichromated gelatin is currently the material of choice for making Combiners due to its high diffraction efficiency, wide bandwidth response, and high values of refractive index modulation (i.e., dichromated gelatin exhibits low "background noise"). However, dichromated gelatin has poor shelf life and requires wet processing after the material has been imaged. Due to its poor shelf life, the material must be freshly prepared shortly before imaging or prehardened gelatin must be used, which reduces image efficiency. Wet processing introduces an additional step in preparation of the holographic Combiner, and causes dimensional changes in the material as it swells, then shrinks, during processing. These dimensional changes affect spacing of the interference fringes. Thus, it is difficult and time consuming to reproducibly make high quality reflection holograms with dichromated gelatin.

Substantially solid, photopolymer films have heretofore been proposed for use in making holograms. U.S. Pat. No. 3,658,526 to Haugh, for instance, discloses preparation of stable, high resolution holograms from solid, photopolymerizable films by a single step process wherein a permanent refractive index image is obtained by a single exposure to a coherent light source bearing holographic information. The holographic image thus formed is not destroyed by subsequent uniform exposure to light, but rather is fixed or enhanced.

Despite the many advantages of the materials proposed by Haugh, they offer only limited viewing response to visible radiation and application has been limited to transmission holograms where the holographic image is viewed by diffraction patterns created in light transmitted through the imaged material. Moreover, the materials disclosed in Haugh have little or no reflection efficiency when the material is imaged to form a reflection hologram. Thus, there continues to be a need for improved materials for use in preparing reflection holograms in general, and a need for improved Optical Combiners offering the processing advantages of the photosensitive elements proposed by Haugh.

SUMMARY OF THE INVENTION

It has now been found that certain photopolymer films, when imaged with coherent light to form a reflection holographic mirror, will have a refractive index modulation greater than 0.001 and are particularly suited for use as Optical Combiners in HUDs. Accordingly, the present invention provides a Combiner comprising a transparent substrate that bears a transparent polymeric film containing a mirror formed by a reflection hologram, said film having a refractive index modulation greater than approximately 0.001 and being formed by exposing to coherent light a composition consisting essentially of:

(a) approximately 25 to 90% of a polymeric binder selected from the group consisting of polyvinyl acetate, polyvinyl butyral, polyvinyl acetal, polyvinyl formal, interpolymers containing major segments thereof, and mixtures thereof;

(b) approximately 5 to 60% of an ethylenically unsaturated monomer selected from the group consisting of carbazole containing monomers and a liquid monomer containing one or more phenyl, biphenyl, phenoxy, naphthyl, naphthyloxy, heteroaromatic group containing up to three aromatic rings, chlorine and bromine;

(c) approximately 0 to 25% of a plasticizer; and (d) approximately 0.1 to 10% of a photoinitiator system activatable by actinic radiation wherein said percentages are weight percentages based on total film weight. Particularly useful are Combiners having a reflection efficiency of at least 15%.

It also has been found, surprisingly, that reflection efficiency of the Combiner is improved if the film is treated with a liquid enhancing agent, or is heated to a temperature of at least 50° C., after the film is imaged to form the mirror.

In another embodiment, the present invention provides a method for forming a Combiner by the steps of:
(a) mounting a transparent support onto one side of a transparent polymeric film having a refractive index modulation of at least 0.001 when imaged, said film consisting essentially of:
  (1) approximately 25 to 90% of a polymeric binder selected from the group consisting of polyvinyl acetate, polyvinyl butyral, polyvinyl acetal, polyvinyl formal, interpolymers containing major segments thereof, and mixtures thereof;
  (2) approximately 5 to 60% of an ethylenically unsaturated monomer selected from the group consisting of carbazole containing monomers and a liquid monomer containing one or more phenyl, biphenyl, phenoxy, naphthyl, naphthyloxy, heteroaromatic group containing up to three aromatic rings, chlorine and bromine;
  (3) approximately 0 to 25% of a plasticizer; and
  (4) approximately 0.1 to 10% of a photoinitiator system activatable by actinic radiation wherein said percentages are weight percentages based on total film weight;
(b) exposing the mounted film to coherent light in a manner that forms a reflection hologram in said film; and
(c) laminating the imaged film to a permanent transparent substrate.

The transparent support conveniently is a flexible film, such as polyethylene terephthalate, which may be removed after the film is laminated to its permanent substrate, such as glass or a transparent plastic substrate. Generally the film will be imaged with coherent light prior to being laminated to the permanent substrate, but it may be imaged after lamination if so desired. Lamination is generally accomplished through the application of heat and pressure; transparent adhesives also may be used to achieve permanent bonding of the film to the substrate, if so desired. The transparent support generally is removed after the lamination, but may be left in place as a protective covering in some applications.

DETAILED DESCRIPTION OF THE INVENTION

Figure 1:
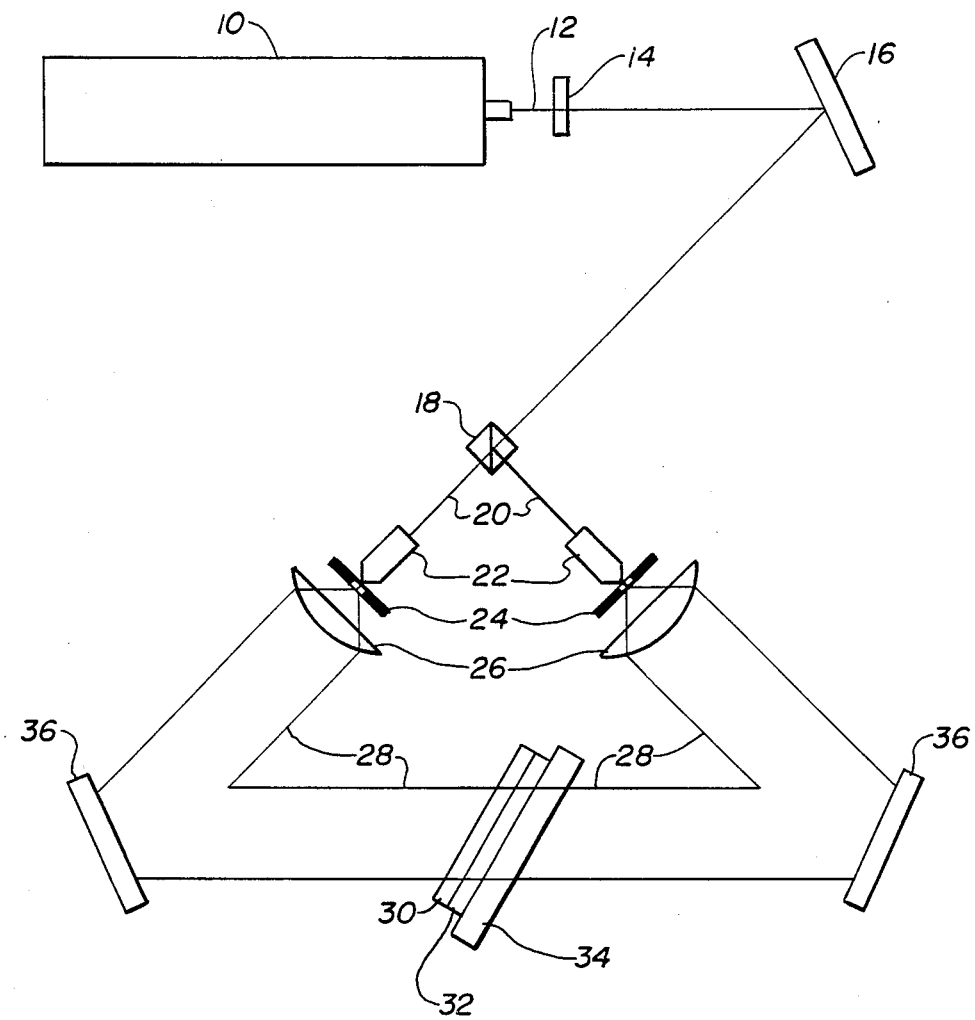
FIG. 1 illustrates an off-axis method of forming a reflection holographic mirror.

In practicing the invention, the photosensitive composition described hereinafter is first cast or laminated to a transparent support that provides structural integrity for the composition (referred to herein as a film) as it is processed to form a Combiner. Since the photosensitive film typically will be only 1 to 100 micrometers in thickness, the support is necessary to prevent film rupture or any stretching during processing that would affect spacing of the interference fringes created in the film that form the holographic image.

The transparent support must have sufficient optical quality that it does not unduly absorb or scatter coherent light passing through it during formation of the holographic mirror. Also, the support must be sufficiently flexible that it will not separate from the film as the film is brought into contact with its permanent mounting surface, such as a curved substrate (e.g., a windshield or helmet visor). Less, if any, flexibility will be needed if the permanent mounting surface is planar, such as a sheet of glass. Exemplary transparent supports that may be selected to advantage include polyethylene terephthalate film, polymethyl methacrylate, polycarbonate, and cellulose triacetate.

POLYMERIC FILM

The polymeric film is substantially solid, transparent, and sufficiently flexible that it can be brought into intimate contact with a surface (e.g., a windshield, helmet visor, or glass sheet) to which it will be mounted. Components of the film include a binder, an ethylenically unsaturated monomer, optionally a plasticizer, and a photoinitiator system. Upon exposure to coherent light as described hereinafter, the monomer polymerizes to form higher molecular weight polymers having a different refractive index and rheological properties than unexposed area of the film. Although the film is substantially solid, components interdiffuse before, during, and after the exposure to coherent light until they are fixed by a final uniform exposure to actinic radiation or by thermal treatment at elevated temperatures. The film typically has a thickness of approximately 1 to 100 micrometers. Thinner films generally will not achieve useful reflection efficiencies. The film reflects radiation (e.g., light) having a spectral and angular bandwidth determined by the thickness and refractive index modulation of the film. Thus, the hologram thickness is matched to the optical requirements of the film and the optical system; i.e., the bandwidth of light that will be used to illuminate the hologram in use (i.e., the display source). In general, relatively thick films will be selected for narrow bandwidth applications, and relatively thin films will be selected for broad bandwidth applications.

BINDER

The binder is the most significant component affecting physical properties of the substantially solid photopolymerizable film. The binder also serves as a matrix for the monomer and photoinitiator system prior to exposure, provides the base line refractive index, and after exposure contributes to the physical and refractive index characteristics needed to form the reflection hologram. Cohesion, adhesion, flexibility, miscibility and tensil strength, in addition to index of refraction, are some of the properties to be considered in selecting the binder for a specific application. Binders that may be selected to advantage in practicing the invention include polyvinyl acetate, polyvinyl butyral, polyvinyl acetal, polyvinyl formal, interpolymers containing major segments of these polymers, and mixtures thereof. Fluorine containing binders, such as copolymers of vinyl acetate and tetrafluoroethylene, may be selected to advantage when it is desired to achieve a high refractive index modulation, such as 0.06 to 0.07.

MONOMERS

The film will contain at least one ethylenically unsaturated monomer that is capable of free radical addition polymerization to produce a crosslinked polymeric material having a refractive index substantially different from that of the binder. The monomer usually will contain the ethylenically unsaturated groups in the terminal position. A liquid monomer generally will be selected, but solid monomers can be used to advantage, either individually or in combination with a liquid monomer, provided that the solid monomer is capable of interdiffusing in the substantially solid film composition and of reacting to form a polymer or copolymer having a refractive index shifted from that of the unimaged composition.

Ethylenically unsaturated monomers useful in the practice of this invention are solid ethylenically unsaturated carbazole monomers (e.g., N-vinyl carbazole) and/or a liquid, ethylenically unsaturated compound capable of addition polymerization and having a boiling point above 100° C. The monomer contains either a phenyl, phenoxy, naphthyl, naphthyloxy, heteroaromatic group containing up to three aromatic rings, chlorine or bromine. The monomer contains at least one such moiety and may contain two or more of the same or different moieties of the group, provided the monomer remains liquid. Contemplated as equivalent to the groups are substituted groups where the substitution may be lower alkyl, alkoxy, hydroxy, phenyl, carboxy, carbonyl, amino, amido, imido or combinations thereof provided the monomer remains liquid and diffusable in the photopolymerizable layer. Suitable monomers which can be used as the sole monomer or in combination with liquid monomers of this type include but are not limited to styrene, 2chlorostyrene, 2-bromostyrene, methoxystyrene, phenyl acrylate, p-chlorophenyl acrylate, 2-phenylethyl acrylate, 2-phenoxyethyl acrylate, 2-phenoxyethyl methacrylate, phenol ethoxylate monoacrylate, 2-(p-chlorophenoxy)ethyl acrylate, benzyl acrylate, 2-(1-naphthyloxy)ethyl acrylate, 2,2-di(p-hydroxyphenyl)propane diacrylate or dimethacrylate, 2,2-di-(p-hydroxyphenyl)propane dimethacrylate, polyoxyethyl-2,2-di-(p-hydroxyphenyl)propane dimethacrylate, di-(3-methacryloxy-2-hydroxypropyl) ether of bisphenol-A, di-(2-methacryloxyethyl) ether of bisphenol-A, di(3-acryloxy-2-hydroxypropyl) ether of bisphenol-A, di(2-acryloxyethyl) ether of bisphenol-A, ethoxylated bisphenol-A diacrylate, di(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2hydroxypropyl) ether of diphenolic acid, 1,4benzenediol dimethacrylate 1,4-diisopropenyl benzene, 1,3,5-triisopropenyl benzene, hydroquinone methyl methacrylate, and 2-[B-(N-carbazoyl)propionyloxy]ethyl acrylate.

Preferred liquid monomers for use in this invention are 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, di(2acryloxyethyl)ether of bisphenol-A, ethoxylated bisphenol-A diacrylate, 2-(1-naphthyloxy)ethyl acrylate, orthobiphenyl methacrylate, and orthobiphenyl acrylate.

Ethylenically unsaturated carbazole monomers having ethylenic substitution on the nitrogen atom of the carbazole moiety typically are solids. Suitable monomers of this type include N-vinyl carbazole and 3,6-dibromo-9-vinyl carbazole. Of these N-vinyl carbazole is preferred. A particularly preferred ethylenically unsaturated monomer comprises N-vinyl carbazole used in combination with the above preferred liquid monomers and, in particular, with 2-phenoxyethyl acrylate, phenol ethoxylate monoacrylate, ethoxylated bisphenol-A diacrylate, or mixtures thereof.

While most monomers useful in this invention are liquids, they may be used in admixture with one or more ethylenically unsaturated solid monomers such as the ethylenically unsaturated carbazole monomers disclosed in *Journal of Polymer Science: Polymer Chemistry Edition*. Vol. 18, pp. 9–18 (1979) by H. Kamogawa et al.; 2-naphthyl acrylate; pentachlorophenyl acrylate; 2,4,6-tribromophenyl acrylate; bisphenol-A diacrylate; 2-(2-naphthyloxy)ethyl acrylate; N-phenyl maleimide; p-biphenyl methacrylate; 2-vinylnaphthalene; 2-naphthyl methacrylate; N-phenyl methacrylamide; and t-butylphenyl methacrylate.

In the embodiment of this invention where crosslinking is desirable, e.g., during thermal enhancement and curing, up to about 5 weight per cent of at least one multifunctional monomer containing two or more terminal ethylenically unsaturated groups typically is incorporated into the photopolymerizable layer. Suitable such multifunctional monomers are the acrylic adducts of bisphenol-A ethers identified above and acrylate and methacrylate esters such as: 1,5-pentanediol diacrylate, ethylene glycol diacrylate, 1,4-butanediol diacrylate, diethylene glycol diacrylate, hexamethylene glycol diacrylate, 1,3propanediol diacrylate, decamethylene glycol diacrylate, decamethylene glycol dimethacrylate, 1,4cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, pentaerythritol tetraacrylate, triethylene glycol diacrylate, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, pentaerythritol tetramethacrylate, trimethylolpropane trimethacrylate, 1,5-pentanediol dimethacrylate, and diallyl fumarate.

Preferred multifunctional monomers include a diacrylate or dimethacrylate of a bisphenol-A epoxy adduct such as di(2-acryloxyethyl) ether of bisphenol-A, ethoxylated bisphenol-A diacrylate, di(3-acryloxy-2-hydroxyphenyl) ether of bisphenol-A, and di(2-acryloxyethyl) ether of tetrabromo-bisphenol-A.

PLASTICIZERS

The polymeric film may contain a plasticizer to modify adhesion, flexibility, hardness, and other mechanical properties of the film in conventional fashion. Suitable plasticizers include triethylene glycol, triethylene glycol diacetate, triethylene glycol dipropionate, triethylene glycol dicaprylate, triethylene glycol dimethyl ether, triethylene glycol bis(2-ethylhexanoate), tetraethylene glycol diheptanoate, poly(ethylene glycol), poly(ethylene glycol) methyl ether, isopropylnaphthalene, diisopropylnaphthalene, poly(propylene glycol), glyceryl tributyrate, diethyl adipate, diethyl sebacate, dibutyl suberate, tributyl phosphate, tris(2-ethylhexyl) phosphate, Brij ® 30 [$C_{12}H_{25}(OCH_2CH_2)_4OH$], and Brij ® 35 [$C_{12}H_{25}(OCH_2CH_2)_{20}OH$]. Particularly preferred plasticizers are triethylene glycol dicaprylate and tetraethylene glycol diheptanoate. Similarly, triethylene glycol dicaprylate and tetraethylene glycol diheptanoate are preferred for use with solid monomers, such as carbazole monomers, in the absence of any second liquid monomers.

PHOTOINITIATOR SYSTEMS

The photoinitiator system has one or more compounds that directly furnish free-radicals when activated by actinic radiation. By "actinic radiation" is meant radiation from a light source, such as a laser, that causes the compound(s) to produce free-radicals to initiate polymerization of the monomer. The system also may contain a sensitizer that is activated by the actinic radiation, causing the compound to furnish the free-radicals. Useful photoinitiator systems typically will contain a sensitizer that extends spectral response into the near ultraviolet, visible, and/or near infrared spectral regions.

A large number of free-radical generating compounds, including redox systems such as Rose Bengal/2-dibutylaminoethanol, may be selected to advantage. Photoreducible dyes and reducing agents such as those disclosed in U.S. Pat. Nos.: 2,850,445; 2,875,047; 3,097,096; 3,074,974; 3,097,097; 3,145,104; and 3,579,339; as well as dyes of the phenazine, oxazine, and quinone classes; ketones, quinones; 2,4,5-triphenylimidazolyl dimers with hydrogen donors, and mixtures thereof as described in U.S. Pat. Nos.: 3,427,161; 3,479,185; 3,549,367; 4,311,783; 4,622,286; and 3,784,557 can be used as initiators. Other initiators are dye-borate complexes disclosed in U.S. Pat. No. 4,772,541; and trichloromethyl triazines disclosed in U.S. Pat. Nos. 4,772,534 and 4,774,163. A useful discussion of dye sensitized photopolymerization can be found in "Dye Sensitized Photopolymerization" by D. F. Eaton in *Adv. in Photochemistry*. Vol. 13, D. H. Volman, G. S. Hammond, and K. Gollinick, eds., Wiley-Interscience, New York, 1986, pp. 427–487. Similarly, the cyclohexadienone compounds of U.S. Pat. No. 4,341,860 are useful as initiators.

Preferred photoinitiators include CDM-HABI, i.e., 2-(o-chlorophenyl)-4,5-bis(m-methoxyphenyl)-imidazole dimer; o-Cl-HABI, i.e., 1,1'-biimidazole, 2,2'-bis(o-chlorophenyl)-4,4',5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

Sensitizers useful with photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769. A preferred group of sensitizers include the bis(p-dialkylaminobenzylidene) ketones disclosed in Baum et al., U.S. Pat. No. 3,652,275, and the arylidene aryl ketones disclosed in Dueber, U.S. Pat. No. 4,162,162.

Particularly preferred sensitizers include the following: DBC, i.e., cyclopentanone; 2,5-bis-{[4-(diethylamino)-2-methylphenyl]-methylene}; DEAW, i.e., cyclopentanone, 2,5-bis{[4-(diethylamino)-phenyl]methylene}; dimethoxy-JDI, i.e., 1H-inden-1-one, 2,3-dihydro-5,6-dimethoxy-2-[(2,3,6,7-tetrahydro-1H, 5H-benzo[i,j]quinolizin-9-yl) methylene]-; and JAW, i.e., cyclopentanone, 2,5-bis[(2,3,6,7-tetrahydro-1H,5H-benzo[i,j]quinolizing-9-yl)methylene]; which have the following structures respectively:

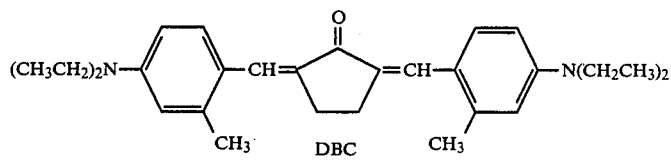

DBC

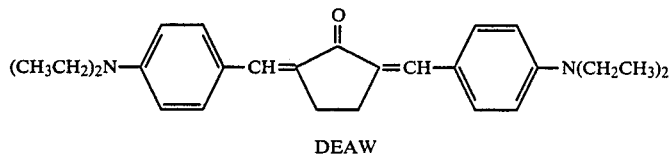

DEAW

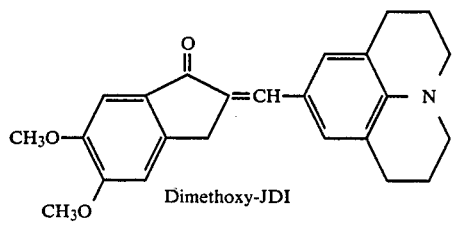

Dimethoxy-JDI

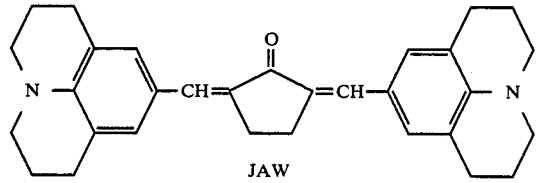

JAW

Other particularly useful sensitizers are cyclopentanone, 2,5-bis[2-(1,3-dihydro-1,3,3-trimethyl-2H-indol-2-ylidene) ethylidene], CAS 27713-85-5; and cyclopentanone, 2,5-bis[2-(l-ethylnaphtho[1,2-d]thiazol-2(1H)-ylidene)ethylidene], CAS 27714-25-6.

OPTIONAL COMPONENTS

Other components conventionally added to photopolymer compositions can also be present to modify the physical properties of the film. Such components include: optical brighteners, ultraviolet radiation absorbing material, thermal stabilizers, hydrogen donors, adhesion modifiers, coating aids, and release agents.

Useful optical brighteners include those disclosed in Held U.S. Pat. No. 3,854,950. A representative optical brightener is 7-(4'-chloro-6'-diethylamino-1',3',5'-triazine-4'-yl) amino 3-phenyl coumarin. Ultraviolet radiation absorbing materials useful in the invention are also disclosed in Held U.S. Pat. No. 3,854,950.

Useful thermal stabilizers include: hydroquinone, phenidone, p-methoxyphenol, alkyl and aryl-substituted hydroquinones and quinones, tert-butyl catechol, pyrogallol, copper resinate, naphthylamines, betanaphthol, cuprous chloride, 2,6-di-tert-butyl p-cresol, phenothiazine, pyridine, nitrobenzene, dinitrobenzene, p-toluquinone and chloranil. The dinitroso dimers described in Pazos U.S. Pat. No. 4,168,982, also may be selected. Normally a thermal polymerization inhibitor will be present to increase stability in the storage of the photopolymerizable composition.

Hydrogen donor compounds that function as chain transfer agents in the photopolymer compositions include: 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercaptobenzothiazole; 2-mercaptobenzothiazole; 1H-1,2,4-triazole-3-thiol; 6-ethoxy-2mercaptobenzothiazole; 4-methyl-4H-1,2,4-triazole-3-thiol; 1-dodecanethiol; and mixtures thereof.

FILM COMPOSITION

Proportions of ingredients in the photopolymer composition generally will be within the following percentage ranges, based on total weight of the composition: binder, 25 to 90%, preferably 45 to 75%; monomer, 5 to 60%, preferably 15 to 50%; plasticizer, 0 to 25%, preferably 0 to 15%; photoinitiator system, 0.1 to 10%, preferably 1 to 7%; and optional ingredients, 0 to 5%, typically 1 to 4%. If the amount of binder is below approximately 25%, or the amount of monomer exceeds approximately 60%, the composition has insufficient viscosity to form a solid film. The presence of binder is held within approximately 90% since performance is unduly lost at higher levels of addition, and resulting films have diminished values of refractive index modulation. Likewise, levels of monomer used will be at least approximately 5% since lower quantities will not produce films having practical values of refractive index modulation.

The composition may be directly coated onto the transparent support described hereinbefore, or may be cast as a film that is then laminated to the transparent support by conventional methods. In either case the transparent support generally provides only temporary dimensional stability for the photopolymer film prior to mounting on its permanent substrate, and thus the support is releasable from the film. For some applications, however, it may be desired to retain the support as a permanent overcoat or protective layer for the photopolymer film, in which case the support and photopolymer film may be permanently bonded. The other side of the supported photopolymer film may have a temporary protective cover sheet, such as a polyethylene or polypropylene film, releasably adhered thereto. Conventional intermediate layers or coatings may be used to facilitate the adhesive and/or release characteristics desired for a particular application.

EXPOSURE OF THE FILMS

Referring to FIG. 1, holographic mirrors may be formed, using the "off-axis" technique, by exposing the films to the intersection of two counter propagating laser beams. The laser (10) produces a laser beam (12) which is controlled by a shutter (14). The laser beam (12) is directed by a mirror (16) into a beam splitter (18) wherein the beam is divided into two equal beam segments (20). Each beam segment (20) passes through a microscope objective (22), pinhole (spacial filter) (24), and collimating lens (26) to produce an expanded, collimated beam (28). Each expanded, collimated beam (28) is reflected by a mirror (36) to converge in the photopolymerizable layer (32). The photopolymerizable layer (32) is mounted on a glass plate (34) and protected by a polyethylene terephthalate film support (30).

Interference fringes are created within the photopolymerizable layer by directing the two beams into the layer at different angles. In the embodiment shown in FIG. 1, this is achieved by simply tilting the glass plate to an angle of 5° to 70° from the line perpendicular to the axis of the two beams. The interference fringes thereby created in the photopolymer are slanted (i.e., the fringes are at an angle to the film plane). The fringes function as a mirror for light having a wavelength similar to that used to form the fringes, and impacting the film at the same angle that was used to form the fringes.

Alternatively, one may use an "on-axis" technique for imaging the film. In this case a coherent beam of light, such as a collimated 488 nm argon-ion laser beam, is projected onto one surface of the film, typically at an angle up to 70° from the normal to the film plane. The collimated beam in part functions as a "reference beam", while a portion is transmitted through the layer and reflected back by a mirror mounted behind the film, thereby functioning as an "object beam". Intersection of the reference beam and object beam, in the film, forms interference fringes that are oriented substantially parallel to the film plane. These fringes form a reflection hologram, which functions as a mirror, when viewed with light projected on the front surface of the film. A potential difficulty with the "on-axis" mode of operation may occur if the film and its support absorb a substantial portion of the beam used to image the film, in which case the reflected object beam may be too weak to form a satisfactory hologram. If this should occur, however, the film formulation is readily adjusted to minimize the problem.

It has been found to be advantageous to preheat the film, and then image the film while it still is at an elevated temperature. In this embodiment the film is heated to a moderate temperature, typically in the range of approximately 30° to 50° C., and then exposed to the coherent light source while the film is still warm. Preheating has been found to improve reflection efficiency of the imaged film and to increase photospeed. Thus, preheating permits use of a lower energy laser and/or allows the imaging step to be completed more quickly.

After the holographic mirror has been formed by either of these techniques, the image is fixed by flooding the film with actinic radiation. This may be achieved by exposing the film to normal room light, but it is preferred to flood the surface with higher intensity light, ultraviolet light, or a combination thereof, to complete polymerization of the monomer component of the film.

The reflection holographic mirrors described above have improved reflection efficiency compared to prior art photopolymer compositions of Haugh. Whereas the Haugh formulations typically will have a reflection efficiency less than 10%, reflection efficiencies in the range of approximately 15% to over 60% are achieved in accordance with the invention. Surprisingly, the reflection efficiencies are even further improved if the imaged film is either further treated with a particular class of liquids that process the hologram, or is heated, as described hereinafter. These enhancement techniques will increase the reflection efficiency, generally two or three fold, to above 70%, and as high as 99%, with no apparent detrimental effects. Concurrently, the holographic mirror can reflect light over a broader bandwidth.

LIQUID ENHANCEMENT

The class of liquids that are particularly effective in enhancing reflection holograms are organic liquids which swell the hologram, e.g., alcohols, ketones, esters, glycol alkyl esters, etc. Use of one or more such enhancing agents is generally all that is required to effect image enhancement. The enhancing agent may be a single liquid or a mixture of such liquids of varying activity. Diluents, e.g., water, hydrocarbon solvents, can be present to decrease the concentration of the enhancing agent. Diluents are "inert solvents" which, when they are applied aloneto the hologram surface, have substantially no effect on reflection efficiency. Diluted enhancing agents are used in the instance when limited equilibrated enhancement is desired at lower than maximum reflectance, or when use of the enhancing agent alone causes some dissolving of the hologram. Additional treatment of such limited equilibrated enhancement is possible with a more concentrated or more active enhancing agent.

Enhancing agent typically is applied after the reflection hologram has been fixed by uniform actinic exposure. The reflection hologram may be immersed in the enhancing agent or may be applied by other means. The procedure for applying the enhancing agent to the imaged holographic recording medium generally is controlled to obtain a uniform enhancement of the reflection hologram and to prevent damage to the polymeric image, which is softened by the swelling action of the enhancing agent. Ideally, just sufficient enhancing agent is needed to uniformly wet the image surface without either flooding it or applying tangential or compressive forces. However, since the rate of enhancement of the diluted agents of this invention is slower and can be repeated, uniformity can be insured by multiple applications. Any method may be used to uniformly apply the enhancing agent to the hologram provided the method does not entail abrasive or compressive forces which would distort or mar the image.

A satisfactory method of applying the enhancing agent is by lightly drawing across the image area the edge of a paint brush or other applicator such as a foraminous wick, soaked in enhancing agent. If the image area is small this procedure might be accomplished with a small brush or a felt-tip pen. If the image area is large, a felt-edge squeegee of sufficient length might be used. In either case the enhancing agent is supplied uniformly from the applicator to the hologram and is absorbed into the hologram to increase its reflection efficiency. In place of felt, any foraminous material may be used such as paper, and woven and nonwoven fabrics. Similarly, the enhancing agent may be applied as a mist, e.g., using an airbrush; or carefully coated as a liquid film. Excess enhancing agent that may be present is removed from this hologram by known means. Normal evaporation or speeded evaporation by air impingement using air at ambient temperature or elevate temperature are useful in removing excess enhancing agent. The enhancing agent may also be removed by treating with diluent nonenhancing agent.

Enhancing agents useful in this invention include: glycol alkyl ethers, e.g., 2-methoxyethanol, 2ethoxyethanol and 2-butoxyethanol; alcohols, e.g., methanol, ethanol, butanol, 1- or 2-propanol; ketones, e.g., acetone, methyl ethyl ketone, cyclohexanone, etc.; esters, e.g., ethyl acetate, etc.; as well as other enhancing agents.

Diluents that may be present with the aforementioned enhancing agent include: water; inert hydrocarbon solvent, e.g., a mixture of $C_{8-10}$ isoparaffins with a boiling point range of 116°–149° C., hexane; cyclohexane; heptane; 1,2-dichloroethane; trichlorotrifluoroethane; and the like.

Typically, maximum enhancement of the entire film is desired, requiring full strength, treatment of the film by a highly active agent. Surprisingly, the reflection efficiency remains at the equilibrated value even after excess agent has been removed. In those instances where immersion is not used or where isolated areas of the film are to be enhanced, controlled methods of application identified above may be used to prevent flooding of the hologram surface and retain the agent in the desired isolated area.

It has been found that liquid enhancement works best with films that have not been Thermally Enhanced (described below). Liquid enhancement increases refractive index modulation and shifts playback wavelength to a higher value. It also has been found that the shift in playback wavelength achieved by liquid enhancement tends to be reversible to the extent that the liquid may subsequently evaporate from the film. Accordingly, it may be desired to select liquids that will remain in the film, once absorbed, or to provide an impervious cover layer over the treated film.

THERMAL ENHANCEMENT

Reflection holograms formed using the unique films of this invention may be thermally treated to irreversibly enhance reflection efficiency up to about 100%. In this embodiment, a reflection holographic mirror is first formed in the film as described above. The film is then heated to a temperature above 50° C., and preferably between 80° and 160° C., for a commensurate time period to maximize enhancement. Two to three fold improvements in refractive index modulation are readily achieved. Thermal enhancement treatment may be carried out either before or after the image is fixed by flooding the film with actinic radiation as described above, but typically it is carried out after the fixing step.

The thermal treatment may concurrently fix the enhanced hologram by thermally hardening or polymerizing the photopolymerizable material in the hologram. Both the rate of thermal enhancement and the rate of thermal hardening increase with increasing temperature, with most of the benefits being achieved during early stages. For example, when using a 100° C. enhancement temperature most of the enhancement occurs during the first 5 to 10 minutes, with little further improvement occurring after one hour.

In the practice of this embodiment of the invention, the reflection hologram is heated by any conventional method. For example, the film may be heated in a simple convection oven, irradiated with infrared or microwave radiation, or contact heated on a hot shoe or in a lamination press. Whichever means is used, care is needed to prevent distortion or damage to the photopolymer layer containing the reflection hologram.

Thermal enhancement is particularly useful in the preparation of Head-Up Displays for use in windshields and other glass laminate structures. Since these structures are curved, it generally is more convenient to image the film to contain the holographic mirror prior to lamination to the glass, rather than after lamination, to simplify the optics needed to image the film. Thus, sufficient heat may be applied during lamination to thermally enhance the holographic mirror.

After removal of the temporary support, the laminated glass sheet may be used as an Optical Combiner in a Head-Up Display. For many applications, however, the laminated glass sheet (after removal of the temporary support) is then placed in a lamination press along with a second matting glass sheet with a Butacite® polymer sheet therebetween so that the photopolymer film is in face to face contact with the Butacite® interleaf. Heat and pressure are applied to the glass-sandwich structure (e.g., about 130° to 150° C.) whereby the reflection hologram is enhanced and fixed concurrently with forming a glass laminate. Surprisingly, a safety glass laminate is thereby formed that contains a holographic mirror substantially free of distortion. The safety glass laminate can be used as the Optical Combiner in a "Head-Up" Display. While glass typically is used in such displays, other transparent sheet material may also be used for other applications, such as quartz, polymethyl methacrylate, polycarbonate, polystyrene, and the like, provided that the selected thermal treatment conditions do not destroy the material.

TREATMENT WITH LIQUID MONOMER

It also has been found that optical properties of the reflection hologram, such as reflection efficiency, tend to be stabilized against degradation over time if the film is treated with a solution containing liquid monomer after the reflection hologram has been formed, and preferably after thermal enhancement. In this treatment the film surface is exposed to the liquid monomer solution by immersion, spraying, or similar techniques to allow the monomer to be absorbed into the film. The monomer may be the same monomer contained in the film composition, or a different liquid monomer. The film is then dried, and the absorbed monomer is polymerized by exposing the film to actinic radiation such as ultraviolet or visible light. This treatment not only has a stabilizing effect on the optical properties, but also affects the spacing between interference fringe planes, thereby causing the holographic mirror to reflect a longer wavelength of light. Reflection efficiency also may be affected. Thus, through the selection of particular liquid monomers, carrying solvent, and soak time before polymerization it is possible to permanently modify the optical properties of the film.

SHIFT IN WAVELENGTH OF RESPONSE

If desired, the film may contain a relatively volatile agent during the imaging step, which is subsequently removed after the imaging. In this embodiment the fringe spacing is reduced when the agent is removed, causing the film to reflect a shorter wavelength than was used to form the fringes. This effect can be achieved through selection of solvents or plasticizers that are compatible with the selected film composition, and which can be removed by evaporation.

EVALUATION OF CANDIDATE FILMS

To evaluate candidate films, holographic mirrors are prepared and values determined for reflection efficiency at the wavelength of maximum reflection. Refractive index modulation (M) is then calculated from the reflection efficiency and film thickness.

Film elements are prepared comprising, in order: a 0.1 mm clear polyethylene terephthalate film support; a dried layer of the candidate photopolymerizable film composition having a thickness of 15 to 35 micrometers; and a 0.023 mm polyethylene terephthalate cover sheet. The film elements are cut into uniform sections, the cover sheet is removed, and the element is hand laminated by contacting the tacky photopolymerizable film composition directly to either a glass plate or the glass back of an aluminum front-surface mirror. The film support is typically left in place to protect the photopolymerizable film composition during exposure and handling operations.

Holographic mirrors are formed in the candidate film compositions mounted on front-surface mirrors, using the "on-axis" technique previously described, by exposure to a collimated laser beam oriented perpendicular to the film plane and reflecting back on itself. Conveniently, the laser beam is the TEM$_{oo}$ mode of an argon laser at 488 or 514 nm, or at a Krypton laser at 647 nm. Coatings mounted on glass plates are generally processed the same as those mounted on the front-surface mirror. After exposure to record the holographic mirror, the film element is overall exposed to ultraviolet and visible light. The film element is then removed from the mirror and transmission spectra is recorded at 400–700 nm using a conventional spectrophotometer. If the film is laminated to a glass or plastic substrate, the processing and measuring steps can be performed without removing the film from the substrate. The intensity of light transmitted through the film at the wavelength of maximum reflection ($I_{trans}$), is measured as well as the intensity of light transmitted through the film in areas where there is no holographic Image ($I_o$). Maximum reflection efficiency ($\eta$) is calculated from the formula: $\eta = [1-(I_{trans}/I_o)]$. Also, the intensity of reflected light is plotted versus wavelength of the light, and the bandwidth is measured at which 50% or more of the reflected light is reflected (i.e., bandwidth at one-half max., fwhm). The holographic mirror is then heated to 80° to 150° C. for 30 to 60 minutes in a convection oven, cooled to room temperature, and analyzed again by recording and measuring the transmission spectra.

Refractive index modulation of the holographic mirror is calculated from the maximum reflection efficiency ($\eta$) using Kogelnik's coupled wave theory, which for an unslanted holographic mirror in which the incident radiation is perpendicular to the plane of the mirror, is represented by the formula:

$$\eta = \tanh^2\left[\frac{\pi M d}{\lambda}\right]$$

where
$\eta$ = the maximum reflection efficiency;
M = refraction index modulation;
$\lambda$ = probe radiation wavelength in free space; and
d = mirror (i.e., film) thickness.
Solving this equation for M, refractive index modulation is calculated as:

$$M = \left[\frac{\lambda \tanh^{-1}\sqrt{\eta}}{\pi d}\right]$$

Refractive index modulation represents the magnitude of differences in refractive index within the film after it has been imaged to contain the reflection hologram. It is not thickness dependent, but describes the inherent capability of the film composition to record a refractive index change, i.e., reflection hologram. Films having higher refractive index modulations will have higher reflection efficiencies and bandwidths at the same thickness.

Useful film compositions that may be selected in practicing the invention have a refractive index modulation of at least 0.001, and generally will be at least 0.005 in order to achieve high reflection efficiencies while minimizing the film thickness. Compositions having a refractive index modulation higher than 0.01 are particularly useful. With these films reflection efficiencies higher than 15%, and generally in the order of 70% to 99%, are readily achieved at film thickness of 10 to 100 micrometers that are particularly useful in the fabrication of Head-Up Displays, notch filters, and the like. From the formula provided above, it is readily computed that 10 and 100 micrometer films having a refractive index modulation of 0.01 will have a reflection efficiency of approximately 31% and 100%, respectively. In contrast, prior art photopolymer compositions that have been proposed by Haugh for holographic applications typically will have a refractive index modulation of 0.001 or less, and holographic mirrors produced from the photopolymer compositions typically have a reflection efficiency no higher than 10% at comparable thicknesses.

HEAD-UP DISPLAYS

Figure 2:
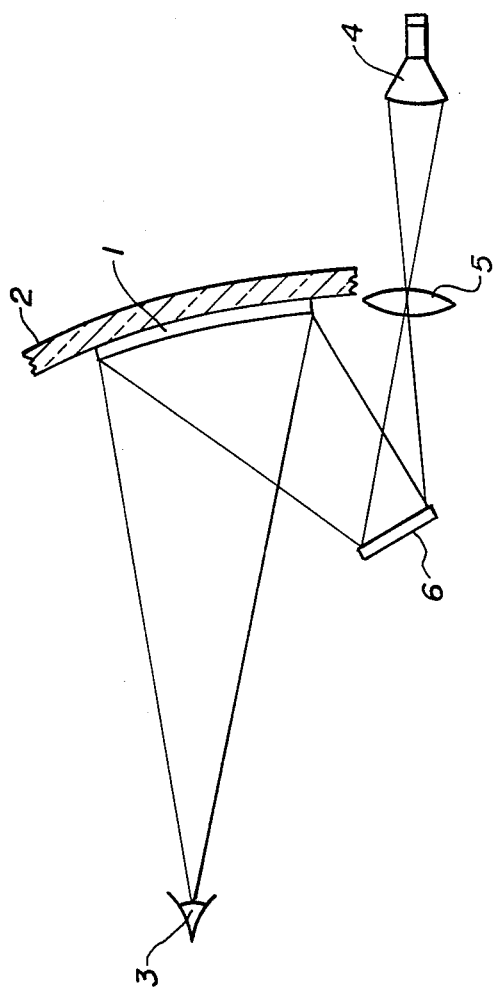
FIG. 2 illustrates a Head-Up Display System.

The laminated glass windshield, either bearing the imaged film on its surface or as a sandwich as described above, may be used as The Optical Combiner in a Head-Up Display (HUD). Referring to FIG. 2, the Combiner (1) is mounted on the front windshield (2) of the vehicle in a position such that displayed information (e.g., vehicle speed, gauge data, etc.) is readily available to the viewer (3). The desired information is projected from a source, such as a CRT or vacuum fluorescent display having a curved faceplate (4), through a projection lens system (5), and onto a mirror (6) that reflects the light onto the Combiner. The Combiner, in turn, reflects the light bearing the desired information to the viewer. Other optical systems for projecting the information onto the Combiner will be apparent to those skilled in the art. Likewise, details of other applications for the Combiner, such as mounting on a pivotal transparent screen or on the visor of a helmet, for aircraft applications, will be apparent to those skilled in the art.

The Optical Combiner only reflects light having a narrow bandwidth that is determined by the wavelength of coherent light that was used to image the film, the imaging geometry, and the subsequent processing of the film. Thus, the broad spectrum of light in front of the vehicle readily passes through the windshield to the viewer, enabling the viewer to see the path of the vehicle although the Combiner is mounted in the field of vision.

EXAMPLES

The invention will now be further illustrated by reference to the following examples, which do not limit the invention:

GENERAL PROCEDURES

Sample Preparation

Coating solutions without visible sensitizer, DEAW or JAW, were prepared under yellow or red light. After addition of DEAW or JAW, all operations on solutions and their resulting coatings were performed under red light only. To further protect them from actinic light, all solutions were prepared and stored in amber bottles. Solutions were prepared by adding components to the solvent and mixing with a mechanical stirrer until they completely dissolved. The solvent was a mixture of dichloromethane (90–95% by weight) and methanol (5%), ethanol (10%), or 2-propanol (10%) unless otherwise specified.

Solutions were coated onto a 4-mil clear film support of polyethylene terephthalate at a speed of 4 to 8 fpm using a Talboy coater equipped with a 6–8 mil doctor knife, 12 ft drier set at 40°–50° C., and a laminator station. A cover sheet of 1 mil polyethylene terephthalate was laminated to the coatings after drying. Coating samples were stored in black polyethylene bags at room temperature until used.

Sample Evaluation

Coated film was cut into 4x5-inch sections, the cover sheet was removed, and the film then mounted by hand laminating the tacky coating directly to either the glass back of an aluminum front-surface mirror or to a glass plate. The film support was left in place during exposure and initial handling operations.

Coatings mounted on front surface mirrors were evaluated by recording holographic mirrors and determining their reflection efficiency, bandwidth, and wavelength of maximum reflection. The holographic mirrors were formed by actinic exposure to a collimated laser beam, $TEM_{oo}$ mode, oriented perpendicular to the film plane and reflecting back on itself. Unless otherwise noted, the 488 nm line of an argon-ion laser was used. The beam had a 2.5–3.0 cm diameter and an intensity of 10–54 mW/cm$^2$. Laser exposure times ranged from 5–10 seconds, corresponding to 200–270 mJ/cm$^2$ total exposure. After recording holographic mirrors, film samples were overall exposed to ultraviolet and visible light using a Douthitt type DCOP-X exposure unit equipped with a mercury arc photopolymer lamp (Theimer-Strahler #5027). The film support and coating were then removed from the front surface mirror and transmission spectra of the unprocessed holographic mirrors were recorded at 400–600 nm using a Hitachi Perkin-Elmer model 330 spectrophotometer. Maximum reflection efficiency, wavelength, and bandwidth at half maximum (fwhm) were determined from the transmission spectra. In examples 28–53 the holographic mirrors were then thermally processed by heating to 80° or 150° C. for 30 minutes in a convection oven, cooled to room temperature, and analyzed again by recording and measuring their transmission spectra.

Coatings mounted on glass plates were exposed to form holographic mirrors, as described above, except each plate was tightly clamped to a front surface aluminum mirror having the plate oriented such that the beam, in order, passes through the glass, the coating, and the film support, and then reflects back on itself. Coating samples with holographic mirrors were overall exposed using the Douthitt exposure unit described above. Where indicated, the plate was index matched using xylene or mineral oil. Generally, the film support was then removed, leaving the coating on the glass plate. Unprocessed holographic mirrors were analyzed by recording and measuring their transmission spectra, after which they were thermally processed by heating to 150° C. in a convection oven, cooled to room temperature, and analyzed again. In some cases, the film support was left in place over the coating during thermal processing and evaluation.

Coating thicknesses were measured on photocured samples by scratching through the coating to the glass plate, then measuring the profile using a Sloan DEK-TAK 3030 surface profile monitoring system. For each sample, the refractive index modulation, M, of the mirror was calculated from the reflection efficiency at the wavelength of maximum reflection, coating thickness, and wavelength of maximum reflection using Kogelnik's, coupled wave theory, previously described. In the Examples, reflection efficiency at the wavelength of maximum reflection is reported as "Reflection Efficiency".

| GLOSSARY OF CHEMICAL NAMES | |
|---|---|
| BHT | 2,6-Di-tert-butyl-4-methylphenol; CAS 128-37-0 |
| Butacite ® B140C | Poly(vinylbutyral), plasticized with 4G7 |
| CAB 531-1 | Cellulose acetate butyrate, Eastman type 531-1; CAS 9004-36-8 |
| DEA | Diethyladipate |
| DEAW | Cyclopentanone, 2,5-bis{[4-(diethylamino)-phenyl]-methylene}; CAS 38394-53-5 |
| EBPDA | Ethoxylated bisphenol-A diacrylate; CAS 24447-78-7 |
| 4G7 | Tetraethylene glycol diheptanoate; HATCOL 5147 |
| 2-HPA | 2-Hydroxypropyl acrylate; propyleneglycol monoacrylate |
| MMT | 4-Methyl-4H-1,2,4-triazole-3-thiol; CAS 24854-43-1 |
| NVC | N-Vinyl carbazole; 9-Vinyl carbazole; CAS 1484-13-5 |
| o-Cl-HABI | 2,2'-Bis(o-chlorophenyl)4,4',5,5'-tetraphenyl-1,1'-biimidazole; CAS 1707-68-2 |
| POEA | 2-Phenoxyethyl acrylate; CAS 48145-04-6 |
| PVB | Poly(vinylbutyral), Aldrich, average M.W. 36,000; CAS 63148-65-2 |
| TDA | Triethylene glycol diacrylate; CAS 1680-21-3 |
| TDC | Triethylene glycol dicaprylate |
| TMPTA | Trimethylolpropane triacrylate; 2-ethyl-2-(hydroxymethyl)-1,3-propanediol triacrylate; CAS 15625-89-5 |
| Vinac ® B-15 | Poly(vinylacetate), Air Products, M.W. 90,000; CAS 9003-20-7 |
| Vinac ® B-100 | Poly(vinylacetate), Air Products, M.W. 500,000; CAS 9003-20-7 |
| FC-430 | Fluorad FC ® 430, liquid nonionic surfactant; 3M Company; CAS 11114-17-3 |
| JAW | Cyclopentanone, 2,5-bis[(2,3,6,7-tetrahydro-1H,5H-benzo[i,j]quinolizin-9-yl)methylene]- |
| PBPM | p-Biphenyl methacrylate |
| Photomer ® 4039 | Phenol ethoxylate monoacrylate; CAS 56641-05-5; Henkel Process Chemicals Co. |
| SR-349 | Ethoxylated bisphenol A diacrylate; CAS 24447-78-7; Sartomer Company, West Chester, PA |
| TBPM | t-Butylphenyl methacrylate. |

CONTROL EXAMPLES A-B; EXAMPLES 1-2

Control Examples A and B, with either NVC or POEA as monomer and CAB as binder, either were inoperative or had poor reflection efficiency and spectral bandwidth. Useful coatings were achieved using poly(vinyl acetate) binder.

The formulations shown below were prepared and coated with a Talboy coater equipped with a 7 mil doctor knife. All quantities are in grams, unless otherwise indicated. The film in control example A was not imaged since it was opaque with crystals as coated. The film from Example 1 also formed crystals but slowly enough to allow imaging of the film. Plates were prepared and holographic mirror imaged as described above except that the 514 nm beam of an argon ion laser was used at a power of about 10 mW. Film thicknesses, reflection efficiencies, and spectral bandwidths are repeated below.

| | Example Number | | | |
|---|---|---|---|---|
| | A | B | 1 | 2 |
| Vinac B-15 | — | — | 14.16 | 14.25 |
| CAB 531-1 | 14.22 | 14.25 | — | — |
| NVC | 9.04 | — | 9.04 | — |
| POEA | — | 9.06 | — | 9.04 |
| o-Cl-HABI | 0.74 | 0.74 | 0.74 | 0.73 |
| MMT | 0.251 | 0.250 | 0.251 | 0.250 |
| DEAW | 0.012 | 0.012 | 0.012 | 0.012 |
| BHT | 0.001 | 0.001 | 0.001 | 0.001 |
| Methanol | 12.2 | 12.2 | 12.2 | 12.2 |
| Methylene Chloride | 110.3 | 109.9 | 110.1 | 109.8 |
| Film Thickness, micron | — | 17.1 | 16.0 | 18.9 |
| Reflection Efficiency, % | — | 3 | 15 | 27 |
| Spectral Bandwidth, nm | — | 5 | 5 | 7 |
| Refractive Index Modulation | — | 0.0017 | 0.0042 | 0.005 |

The holographic mirrors were then processed in a bath composed of 3% cyclohexanone in isopropanol. The mirrors were immersed in the bath for two minutes, air dried for about five minutes, immersed in the developer bath for another two minutes, and air dried overnight. After drying, % transmission spectra were obtained. The bandwidth for Example 1 could not be measured due to the low reflection efficiency and width of the transmission band. The film from Example B wrinkled during development and a reflection could not be detected. Data obtained is given below.

|  | Example Number | | | |
| --- | --- | --- | --- | --- |
|  | A | B | 1 | 2 |
| Reflection Efficiency, % | — | — | 3 | 78 |
| Spectral Bandwidth, nm | — | — | — | 18 |
| Refractive Index Modulation | — | — | 0.0018 | 0.012 |

EXAMPLE 3

This example shows good performance using poly(-vinylbutyral), particularly in compositions combining NVC and POEA liquid monomer.

| Butacite ® B140C | 179.8 g |
| --- | --- |
| POEA | 54.9 g |
| NVC | 37.6 g |
| o-Cl-HABI | 2.5 g |
| MMT | 2.5 g |
| BHT | 0.025 g |
| DEAW | 0.509 g |
| Methanol | 554 g |
| Tetrahydrofuran | 554 g |

The formulation was hand coated onto 4 mil polyethylene terephthalate film through a 1 mil doctor knife. The film was air dried at room temperature before applying at 1 mil polyethylene terephthalate film as cover sheet. Plates were prepared and holographic mirrors imaged as described above. Each plate was exposed for 90 seconds with the 488 nm beam with a power of about 30 mW. The plate and mirror combination were oriented at either normal to or 40° off normal to the incident laser beam. Exposures made at normal to the incident beam will be referred to as "0°" and those at 40° off normal will be referred to as "40°". The following results were obtained:

| Angle | Measured Reflection Efficiency |
| --- | --- |
| 40° | 13% |
| 40° | 12% |
| 0° | 18% |
| 0° | 20% |

EXAMPLES 4-6

A stock formulation was prepared using 75 g of Butacite® B140C, 6.25 g o-Cl-HABI, 2.5 g MMT, 0.125 g DEAW, and 500 g 10% methanol/90% methylene chloride. From this stock formulation three separate film formulations were prepared using 117 g portions for each formulation and adding to each formulation a total of 8 g of monomer. Each formulation was coated as described above. Film samples were mounted on glass plates and holographic mirrors prepared as in Example 3. The plate and mirror combination was oriented normal to the incident laser beam. Results are shown below.

| Example Number | Monomer(s) | Reflection Efficiency |
| --- | --- | --- |
| 4 | 100% POEA | 2% |
| 5 | 100% NVC | 4% |
| 6 | 40.6% NVC, 59.4% POEA | 15% |

EXAMPLES 7-11

These are useful compositions similar to the poly(-vinylbutyral) Examples 3-6, but include a liquid plasticizer. The examples illustrate that favorable and also show that good results can be obtained including a liquid plasticizer.

The formulations listed below were coated as described above. All quantities are in grams, unless otherwise indicated. Plates were prepared as described above and holographic mirrors generated by splitting the 488 nm beam from an Argon ion laser and impinging the collimated coherent beams onto opposite sides of the plate with the angle between them about 180°. All films were exposed for 90 seconds. Reflection efficiencies and film thicknesses are given below.

|  | Example Number | | | | |
| --- | --- | --- | --- | --- | --- |
|  | 7 | 8 | 9 | 10 | 11 |
| PVB | 10.6 | 10.6 | 10.6 | 13.1 | 10.6 |
| NVC | 5.20 | 5.19 | 5.19 | 5.20 | 6.99 |
| POEA | 2.08 | 2.08 | 2.08 | 2.08 | 2.79 |
| TDC | 2.51 | — | — | — | — |
| DEA | — | 2.67 | — | — | — |
| 4G7 | — | — | 2.56 | — | — |
| o-Cl-HABI | 0.643 | 0.642 | 0.642 | 0.643 | 0.643 |
| MMT | 0.209 | 0.209 | 0.209 | 0.209 | 0.209 |
| DEAW | 0.011 | 0.011 | 0.011 | 0.011 | 0.011 |
| BHT | 0.001 | 0.001 | 0.001 | 0.001 | 0.001 |
| Methanol | 10.4 | 10.4 | 10.4 | 10.4 | 10.4 |
| Methylene Chloride | 93.5 | 93.4 | 93.4 | 93.5 | 93.5 |
| Film thickness, micron | 20.6 | 20.5 | 20.5 | 19.8 | 19.0 |
| Reflection Efficiency, % | 21 | 27 | 20 | 28 | 19 |
| Refractive Index Modulation | 0.0037 | 0.0044 | 0.0036 | 0.0046 | 0.0038 |

EXAMPLES 12 AND 13

These are useful compositions with poly(vinylacetate) binder, combined with a mixture of NVC and POEA monomer and TDC plasticizer. The formulations listed below were coated and holographic mirrors imaged as described in Example 7 except that exposure times for both films were 60 seconds. Film thicknesses and reflection efficiencies are reported below.

|  | Example Number | |
| --- | --- | --- |
|  | 12 | 13 |
| Vinac B15 | 12.6 | 15.1 |
| NVC | 6.18 | 2.47 |
| POEA | 2.55 | 6.1 |
| TDC | 2.56 | — |
| o-Cl-HABI | 0.75 | 0.76 |
| MMT | 0.26 | 0.25 |
| DEAW | 0.012 | 0.012 |
| BHT | 0.0013 | 0.0016 |
| Methanol | 12.3 | 12.3 |
| Methylene Chloride | 110.2 | 110.2 |
| Film thickness, micron | 18.6 | 18.6 |
| Reflection Efficiency, % | 22 | 22 |
| Refractive Index Modulation | 0.0042 | 0.0042 |

EXAMPLES 14-20

Additional useful compositions prepared from poly(vinylacetate) showing the advantage of using NVC/POEA mixtures are shown below. The listed formulations were coated and holographic mirrors imaged as described in Example 7. Reflection efficiencies and film thicknesses are reported below.

| | Example Number | | | |
|---|---|---|---|---|
| | 14 | 15 | 16 | 17 |
| Vinac B15 | 12.5 | 12.5 | 12.5 | 12.5 |
| NVC | — | 2.53 | 3.51 | 1.54 |
| POEA | 7.85 | 5.30 | 4.23 | 6.24 |
| TDC | — | — | — | — |
| o-Cl-HABI | 0.617 | 0.617 | 0.617 | 0.617 |
| MMT | 0.029 | 0.029 | 0.029 | 0.0209 |
| DEAW | 0.010 | 0.010 | 0.010 | 0.010 |
| BHT | 0.001 | 0.001 | 0.001 | 0.001 |
| Methanol | 10.2 | 10.2 | 10.2 | 10.2 |
| Methylene Chloride | 91.5 | 91.4 | 91.4 | 91.4 |
| Film thickness, micron | —* | 15.0 | 13.1 | 12.8 |
| Reflection Efficiency, % | 4 | 38 | 13 | 18 |
| Refractive Index Modulation | — | 0.0074 | 0.0045 | 0.0055 |

| | Example Number | | |
|---|---|---|---|
| | 18 | 19 | 20 |
| Vinac B15 | 14.0 | 12.5 | 14.0 |
| NVC | — | 1.51 | — |
| POEA | 6.23 | 5.45 | 4.23 |
| TDC | — | 1.02 | 1.10 |
| o-Cl-HABI | 0.617 | 0.617 | 0.617 |
| MMT | 0.209 | 0.209 | 0.209 |
| DEAW | 0.010 | 0.010 | 0.010 |
| BHT | 0.001 | 0.001 | 0.001 |
| Methanol | 10.2 | 10.2 | 10.2 |
| Methylene Chloride | 91.4 | 91.4 | 91.4 |
| Film thickness, micron | 14.2 | 15.3 | 13.5 |
| Reflection Efficiency, % | 11 | 28 | 4 |
| Refractive Index Modulation | 0.0038 | 0.0060 | 0.0023 |

*not measured

EXAMPLES 21-23

These examples illustrate useful results can be obtained independent of poly(vinylacetate) molecular weight. The listed formulations were coated and holographic mirrors imaged as in Example 7.

Reflection efficiencies and film thicknesses are reported below.

| | Example Number | | |
|---|---|---|---|
| | 21 | 22 | 23 |
| Polyvinyl Acetate, Low MW, Aldrich | 37.4 | — | — |
| Polyvinyl Acetate, Medium MW, Aldrich | — | 37.4 | — |
| Polyvinyl Acetate, High MW, Aldrich | — | — | 37.4 |
| NVC | 7.63 | 7.62 | 7.56 |
| POEA | 16.0 | 16.0 | 15.9 |
| o-Cl-HABI | 1.86 | 1.86 | 1.87 |
| MMT | 0.625 | 0.625 | 0.627 |
| DEAW | 0.031 | 0.030 | 0.033 |
| BHT | 0.004 | 0.003 | 0.003 |
| Methanol | 25.1 | 25.2 | 25.2 |
| Methylene Chloride | 241.2 | 227.1 | 226.7 |
| Film thickness, micron | 21.9 | 22.5 | 19.0 |
| Reflection Efficiency, % | 49 | 49 | 49 |
| Refractive Index Modulation | 0.0062 | 0.0060 | 0.0071 |

EXAMPLE 24

This example shows a useful poly(vinylformal) composition. The formulation below was coated and a holographic mirror imaged as described in Example 7 except that a 30 second exposure was used.

| Polyvinyl formal | 37.4 |
|---|---|
| NVC | 7.57 |
| POEA | 15.9 |
| o-Cl-HABI | 1.87 |
| MMT | 0.626 |
| DEAW | 0.030 |
| BHT | 0.003 |
| Methanol | 25.1 |
| Methylene Chloride | 226.1 |
| Film thickness, micron | 16.7 |
| Reflection Efficiency, % | 20 |
| Refractive Index Modulation | 0.0045 |

EXAMPLE 25

This and Examples 26 and 27 show a substantial reflection efficiency increase from treating the holographic mirror with a swelling solvent, whereas the prior art control composition (Example E) does not.

The formulation below was coated through a 6 mil doctor knife applicator. Plates were prepared and holographic mirrors imaged as described in the general procedures. Film thickness and reflection efficiency are reported below.

| Vinac B15 | 37.5 |
|---|---|
| NVC | 7.64 |
| POEA | 15.9 |
| o-Cl-HABI | 1.86 |
| MMT | 0.625 |
| DEAW | 0.035 |
| BHT | 0.004 |
| Methanol | 25.2 |
| Methylene Chloride | 226.7 |
| Film thickness, micron | 16.9 |
| Reflection Efficiency, % | 44 |
| Spectral Bandwidth, nm | 6 |
| Refractive Index Modulation | 0.0073 |

After obtaining the above data, the holographic mirror was processed by gently wiping over the mirror was processed by gently wiping over the mirror a cotton swab containing acetone. After air drying for about 30 minutes a % transmission spectrum was recorded. The reflection efficiency had increased to 62% and the spectral bandwidth had increased to 35 nm. The refractive index modulation is 0.0098.

EXAMPLE 26

The formulation shown below was coated with a 7 mil doctor knife applicator. Plates were prepared and holographic mirrors imaged as described in the general procedures. Film thickness, reflection efficiency and spectral bandwidth are listed below.

| Vinac B15 | 37.5 |
|---|---|
| NVC | 7.55 |
| POEA | 15.9 |
| o-Cl-HABI 1.83 | |
| MMT | 0.623 |
| DEAW | 0.017 |
| BHT | 0.004 |
| Methanol | 25.1 |
| Methylene Chloride | 225.8 |

| | | |
|---|---|---|
| Film thickness, micron | 25.8 | |
| Reflection Efficiency, % | 48 | (average 8 mirrors - all imaged identically) |
| Spectral Bandwidth, nm | 6–7 | (average 8 mirrors - all imaged identically) |
| Refractive Index Modulation | 0.0051 | |

The holographic mirrors were then processed in a bath composed of 800 ml water and 600 ml acetone. The mirrors were immersed in the bath for 30 seconds, then water washed for 30 seconds, and then air dried. After drying, % transmission spectra were obtained. Data obtained is given below.

| | | |
|---|---|---|
| Maximum Reflection Efficiency, % | 77 | (average 3 mirrors- all imaged and processed identically) |
| Spectral Bandwidth, nm | 22–28 | (average 3 mirrors all imaged and processed identically) |
| Refractive Index Modulation | 0.0082 | |

EXAMPLE 27 AND CONTROL EXAMPLES C-E

The formulations below were coated through a 7 mil doctor knife applicator. Plates were prepared as described above and holographic mirrors imaged as described in the General Procedures. Results are reported below.

| | Example Number | | | |
|---|---|---|---|---|
| | 27 | C | D | E |
| Vinac B15 | 14.2 | — | 14.2 | — |
| CAB 531-1 | — | 14.2 | — | 14.1 |
| TDA | — | — | 9.04 | 9.04 |
| NVC | 2.50 | 2.50 | — | — |
| POEA | 6.49 | 6.50 | — | — |
| o-Cl-HABI | 0.73 | 0.73 | 0.74 | 0.74 |
| MMT | 0.249 | 0.249 | 0.260 | 0.260 |
| DEAW | 0.012 | 0.012 | 0.012 | 0.012 |
| BHT | 0.001 | 0.001 | 0.001 | 0.001 |
| Methanol | 12.2 | 12.2 | 12.3 | 12.3 |
| Methylene Chloride | 109.8 | 110.0 | 110.2 | 110.1 |
| Film thickness, micron | 16.9 | 17.7 | 17.0 | 16.4 |
| Reflection Efficiency, % | 23 | 10 | 1 | 0 |
| Spectral Bandwidth, nm | 6 | 6 | — | — |
| Refractive Index Modulation | 0.0048 | 0.0029 | 0.0009 | 0.0000 |

The holographic mirrors were then processed in a bath composed of 3% cyclohexanone in 2-propanol. The mirrors were immersed in the bath for two minutes, air dried for about five minutes, immersed in the developer bath for another two minutes, and air dried overnight. After drying, % transmission spectra were obtained.

| | Example Number | | | |
|---|---|---|---|---|
| | 27 | C | D | E |
| Reflection Efficiency, % | 75 | 6 | — | — |
| Spectral Bandwidth, nm | 14 | — | — | — |

| | Example Number | | | |
|---|---|---|---|---|
| | 27 | C | D | E |
| Refractive Index Modulation | 0.0121 | 0.0022 | — | — |

EXAMPLES 28–31

These are useful compositions containing Vinac B-15, a low molecular weight poly(vinylacetate) binder and various crosslinking monomers. Reflection holograms recorded in these compositions can be thermally processed to obtain greater reflection efficiency and bandwidth.

Four formulations were prepared, each containing a crosslinking acrylate monomer, with or without POEA, as described below, and each containing 14.2 g Vinac B-15 (56.96% by weight of total solids), 3.0 g NVC (12%), 1.0 g o-Cl-HABI (4.0%), 0.50 g MMT (2.0%), 0.0075 g DEAW (0.03%), 71.25 g dichloromethane, and 3.75 g methanol. The formulations were coated on polyethylene terephthalate film, mounted on the back of a front-surface mirror, exposed, and evaluated according to the general procedures given above. The reflection efficiency, bandwidth, and wavelength of maximum reflection are presented below.

| | Example Number | | | |
|---|---|---|---|---|
| | 28 | 29 | 30 | 31 |
| POEA, grams (wt %) | — | 3.75 (15) | 5.00 (20) | 5.00 (20) |
| EBPDA, grams (wt %) | 6.25 (25) | 2.50 (10) | — | — |
| TDA, grams (wt %) | — | — | 1.25 (5) | — |
| TMPTA, grams (wt %) | — | — | — | 1.25 (5) |
| Thickness, microns | 24.8 | 27.4 | 27.2 | 28.0 |
| *Unprocessed mirrors* | | | | |
| Reflection Efficiency, % | 67.5 | 61.0 | 46.0 | 47.0 |
| fwhm, nm | 5 | 5 | 5 | 5 |
| λmax, nm | 476.5 | 478.5 | 476.5 | 477.0 |
| Refractive Index Modulation | 0.0071 | 0.0058 | 0.0046 | 0.0046 |
| *Thermally processed: 80° C., 30 minutes, mirrors on polyethylene terephthalate film* | | | | |
| Reflection Efficiency, % | 91 | 91 | 93 | 92 |
| fwhm, nm | 11 | 27 | 23 | 27 |
| λmax, nm | 472 | 466 | 465 | 467 |
| Refractive Index Modulation | 0.0114 | 0.0101 | 0.0109 | 0.0103 |
| *Thermally processed: 150° C., 30 minutes, mirrors on polyethylene terephthalate film* | | | | |
| Reflection Efficiency, % | 84.0 | 99.8 | 99.6 | 99.9 |
| fwhm, nm | 31 | 25 | 25 | 26 |
| λmax, nm | 453 | 447 | 447 | 449 |
| Refractive Index Modulation | 0.0091 | 0.0197 | 0.0181 | 0.0212 |

EXAMPLES 32–35

These are useful compositions containing a low molecular weight poly(vinylacetate) binder, TMPTA crosslinking monomer, and varied amounts of POEA and NVC. Reflection holograms recorded in these compositions can be thermally processed to obtain greater reflection efficiency and bandwidth.

Four formulations were prepared, each containing TMPTA and POEA with or without NVC, as described in the following table, and each containing 28.48 g Vinac B-15 (56.96% by weight of total solids), 2.0 g o-Cl-HABI (4.0%), 1.0 g MMT (2.0%), 0.015 g DEAW (0.03%), 0.005 g BHT (0.01%), 7.5 g methanol, and 142.5 dichloromethane. The formulations were coated on film support, mounted on glass plates, exposed, and evaluated according to the general procedures given above. The reflection efficiency, bandwidth, and wavelength of maximum reflection are presented below.

EXAMPLE 36

This is a useful composition containing a low molecular weight poly(vinylacetate) binder, TMPTA crosslinking monomer, and 4G7 plasticizer. Reflection holograms recorded in this composition can be thermally processed to obtain greater reflection efficiency and bandwidth.

A formulation was prepared containing POEA, TMPTA, NVC, and 4G7, as described below, and containing 14.24 g Vinac B-15 (56.06% by weight of total solids), 1.0 g o-Cl-HABI (4.0%), 0.5 g MMT (2.0%), 0.0075 g DEAW (0.03%), 0.0025 g BHT (0.01%), 3.75 g methanol, and 71.25 g dichloromethane. The formulation was coated and evaluated as in Examples 32–35. The reflection efficiency, bandwidth, and wavelength of maximum reflection are presented below.

radation, at temperatures of about 80° C. or less, to obtain greater reflection efficiency and bandwidth.

A formulation was prepared containing POEA and NVC, as described below, and containing 284.8 g of Vinac B-15 (56.96% by weight of total solids), 20.0 g o-Cl-HABI (4.0%), 10.0 g MMT (2.0%), 0.15 g DEAW (0.03%), 0.05 g BHT (0.01%), 75 g methanol, and 1,425 g dichloromethane. The formulation was coated and evaluated as described in Examples 28 and 32, except an extrusion-die coating bar attached to the Talboy coater was used instead of a doctor knife. The reflection efficiency, bandwidth, and wavelength of maximum reflection are presented below.

EXAMPLES 38–41

These are useful compositions containing a low molecular weight poly(vinylacetate) binder and varied amounts of TMPTA crosslinking monomer. Reflection holograms recorded in these compositions can be thermally processed to obtain greater reflection efficiency and bandwidth.

Four formulations were prepared, each containing TMPTA, POEA, and NVC, as described below, and each containing 289.5 g Vinac B-15 (56.96% by weight of total solids), 2.0 g o-Cl-HABI (4.0%), 1.0 g MMT (2.0%), 0.015 g DEAW (0.03%), 0.005 g BHT (0.01%)

|  | Example Number | | | | |
|---|---|---|---|---|---|
|  | 32 | 33 | 34 | 35 | 36 |
| TMPTA, grams (wt %) | 2.5 (5) | 2.5 (5) | 2.5 (5) | 2.5 (5) | 1.25 (5) |
| POEA, grams (wt %) | 16.0 (32) | 13.0 (26) | 10.0 (20) | 8.0 (16) | 3.75 (15) |
| NVC, grams (wt %) | — | 3.0 (6) | 6.0 (12) | 8.0 (16) | 3.0 (12) |
| 4G7, grams (wt %) | — | — | — | — | 1.25 (5) |
| Thickness, microns | 22.3 | 21.6 | 24.2 | 24.5 | 22.4 |
| Unprocessed mirrors | | | | | |
| Reflection Efficiency, % | 32 | 51 | 64 | 66 | 58 |
| fwhm, nm | 6 | 5 | 5 | 5 | 6 |
| λmax, nm | 476 | 477 | 477 | 478 | 478 |
| Refractive Index Modulation | 0.0044 | 0.0063 | 0.0069 | 0.0070 | 0.0068 |
| Thermally processed: 150° C., 90 minutes, mirrors on glass, film support removed | | | | | |
| Reflection Efficiency, % | 56 | 89 | 99.9 | 99.8 | 99.4 |
| fwhm, nm | 22 | 32 | 30 | 30 | 30 |
| λmax, nm | 464 | 458 | 447 | 437 | 437 |
| Refractive Index Modulation | 0.0064 | 0.0119 | 0.0244 | 0.0216 | 0.0202 |
| Thermally processed: 150° C., 90 minutes, mirrors between glass and film support | | | | | |
| Reflection Efficiency, % | 56 | 80 | 99.9 | 99.2 | 84 |
| fwhm, nm | 16 | 25 | 30 | 42 | 35 |
| λmax, nm | 467 | 471 | 470 | 476 | 462 |
| Refractive Index Modulation | 0.0065 | 0.0100 | 0.0256 | 0.0192 | 0.0103 |

EXAMPLE 37

This is a useful composition containing a low molecular weight poly(vinylacetate) binder, but no crosslinking monomer. Reflection holograms recorded in this composition can be thermally processed, without deg- 7.5 g methanol, and 142.5 g dichloromethane. The formulations were coated and evaluated as described in Example 32. The reflection efficiency bandwidth, and wavelength of maximum reflection are presented below.

|  | Example Number | | | | |
|---|---|---|---|---|---|
|  | 37 | 38 | 39 | 40 | 41 |
| TMPTA, grams (wt %) | — | 0.5 | 1.0 | 3.5 | 4.5 |

-continued

| | Example Number | | | | |
|---|---|---|---|---|---|
| | 37 | 38 | 39 | 40 | 41 |
| | | (1) | (2) | (7) | (9) |
| POEA, grams (wt %) | 125 | 12.0 | 11.5 | 9.0 | 8.0 |
| | (25) | (24) | (23) | (18) | (16) |
| NVC, grams (wt %) | 60 | 6.0 | 6.0 | 6.0 | 6.0 |
| | (12) | (12) | (12) | (12) | (12) |
| Thickness, microns | 26.1 | 20.6 | 27.0 | 26.7 | 23.2 |
| *Unprocessed mirrors* | | | | | |
| Reflection Efficiency, % | 57 | 67 | 72 | 50 | 53 |
| fwhm, nm | 5 | 5 | 5 | 5 | 5 |
| λmax, nm | 476 | 478 | 478 | 477 | 477 |
| Refractive Index Modulation | 0.0057 | 0.0085 | 0.0070 | 0.0050 | 0.0061 |
| *Thermally processed: 80° C., 30 minutes, mirrors on film support (not determined for 38–41)* | | | | | |
| Reflection Efficiency, % | 62 | — | — | — | — |
| fwhm, nm | 40 | — | — | — | — |
| λmax, nm | 464 | — | — | — | — |
| Refractive Index modulation | 0.0060 | | | | |
| *Thermally processed: 150° C., 90 minutes, mirrors on glass, film support removed* | | | | | |
| Reflection Efficiency, % | 0$^a$ | 0$^a$ | 99.9 | 99.4 | 98.7 |
| fwhm, nm | — | — | 33 | 27 | 22 |
| λmax, nm | — | — | 448 | 444 | 443 |
| Refractive Index Modulation | | | 0.0219 | 0.0172 | 0.0174 |
| *Thermally processed: 150° C., 90 minutes, mirrors between glass and film support* | | | | | |
| Reflection Efficiency, % | 0$^a$ | 99.9 | 99.9 | 99.6 | 98.8 |
| fwhm, nm | — | 37 | 37 | 31 | 25 |
| λmax, nm | — | 469 | 469 | 472 | 472 |
| Refractive Index | — | 0.0301 | 0.0229 | 0.0194 | 0.0246 |

$^a$Coating hazy, hologram destroyed or very weak

EXAMPLES 42–43

These are examples of a low molecular weight poly(vinylacetate) based compositions for recording reflection holograms and use of these compositions to produce automobile windshield safety glass with a reflection hologram internally mounted (as might be used for head-up displays).

Two formulations were prepared, each containing Vinac B-15, TMPTA, POEA, and NVC as described below, and each containing 2.0 g o-Cl-HABI (4.0%), 1.0 g MMT (2.0%), 0.015 g DEAW (0.03%), 0.005 g BHT (0.01%), 7.5 g methanol, and 142.5 dichloromethane. The formulations were coated on polyethylene terephthalate film support mounted on glass plates and exposed as described in the general procedures.

Unprocessed holographic mirrors on glass, film support removed, were analyzed by recording and measuring their transmission spectra; results are given below. A sheet of 30-mil Butacite ® was then placed over each holographic mirror and a second piece of glass placed on the opposite side of the Butacite ®, thus forming glass-hologram-Butacite ®-glass composite structures which were clamped tightly together and heated to 150° C. under vacuum for 60 minutes. The (safety) glass composite structures were then removed from the vacuum oven, allowed to cool to room temperature, and analyzed by recording and measuring their transmission spectra. Results are presented below.

EXAMPLE 44

This is an example of a low molecular weight poly(vinylacetate) based composition containing 2-HPA, and its use to produce safety glass with an internally mounted reflection hologram.

A formulation was prepared containing Vinac B-15, TMPTA, POEA, NVC, and 2-HPA, as described below, and containing 1.0 g o-Cl-HABI (4.0%), 0.5 g MMT (2.0%), 0.0075 g DEAW (0.03%), 0.0025 g BHT (0.01%), 3.75 g methanol, and 71.25 g dichloromethane. The formulation was coated and evaluated as in Example 42. Results are presented below.

EXAMPLE 45

This is a useful composition containing Vinac B-100, a high molecular weight poly(vinylacetate) binder, and TMPTA crosslinking monomer. Reflection holograms recorded in this composition can be thermally processed to obtain greater reflection efficiency and bandwidth. This composition is also useful for producing safety glass with internally mounted reflection holograms.

A formulation was prepared containing Vinac B-100, TMPTA, POEA, NVC, and 2-HPA, as described below, and containing 0.75 g o-Cl-HABI (3.0%), 0.25 g MMT (1.0%), 0.010 g DEAW (0.04%), 0.0025 g BHT (0.01%), 3.75 g methanol, and 71.25 g dichloromethane. The formulation was coated and evaluated as in Example 42, except exposure was with a 514 nm argon ion laser beam, the holographic mirror was thermally processed before making the safety glass composite, and a longer heating cycle was used in making the safety glass composite, as shown in the table below.

| | Example Number | | | |
|---|---|---|---|---|
| | 42 | 43 | 44 | 45 |
| Vinac B-15 grams (wt. %) | 28.48 (57) | 28.48 (57) | 14.24 (57) | — |
| Vinac B-100 grams (wt. %) | — | — | — | 14.73 (59) |

|  | Example Number | | | |
|---|---|---|---|---|
|  | 42 | 43 | 44 | 45 |
| TMPTA, grams (wt. %) | 2.50 (5) | 4.50 (9) | 1.25 (5) | 1.75 (7) |
| POEA, grams (wt. %) | 10.00 (20) | 8.00 (16) | 3.75 (15) | 3.25 (13) |
| NVC, grams (wt. %) | 6.00 (12) | 6.00 (12) | 3.00 (12) | 3.00 (12) |
| 2-HPA, grams (wt. %) | — | — | 1.25 (5) | 1.25 (5) |
| Thickness, microns | 24.2 | 23.2 | 21.5 | 22.4 |
| *Unprocessed mirrors* | | | | |
| Reflection Efficiency, % | 65 | 57 | 50 | 32 |
| fwhm, nm | 4 | 4 | 4 | 5 |
| $\lambda_{max}$, nm | 477 | 476 | 477 | 503 |
| Refractive Index Modulation | 0.0070 | 0.0064 | 0.0062 | 0.0046 |
| *Thermally processed: 150° C., 60 minutes, mirrors between glass and Butacite ®* | | | | |
| Reflection Efficiency, % | 84 | 80 | 85 | — |
| fwhm, nm | 50 | 33 | 55 | — |
| $\lambda_{max}$, nm | 498 | 503 | 510 | — |
| Refractive Index Modulation | 0.013 | 0.0100 | 0.0121 | — |
| *Thermally processed: 100° C., 30 minutes, then 150° C., 60 min., mirrors on glass* | | | | |
| Reflection Efficiency, % | — | — | — | 73 |
| fwhm, nm | — | — | — | 20 |
| $\lambda_{max}$, nm | — | — | — | 493 |
| Refractive Index Modulation | — | — | — | 0.0089 |
| *(Processed continued) then 150° C., 90 minutes, mirrors between glass and Butacite ®* | | | | |
| Reflection Efficiency, % | — | — | — | 72 |
| fwhm, nm | — | — | — | 15 |
| $\lambda_{max}$, nm | — | — | — | 562 |
| Refractive Index Modulation | — | — | — | 0.0100 |

Values not determined where blanks (—) are in Table

EXAMPLES 46-47

These are useful compositions containing high molecular weight poly(vinylacetate) binder with and without a crosslinking monomer. Reflection holograms recorded in these compositions can be thermally processed to obtain greater reflection efficiency and bandwidth.

Two formulations were prepared as listed below. The formulations were coated as in the general procedures given above, except an extrusion-die coating bar was used rather than a doctor knife, and the drier was set at 50°–60° C. Coatings were mounted on glass plates, exposed and evaluated according to the general procedure, except total laser exposure for each mirror was 300 mJ/cm². Results are presented below.

|  | Example Number | |
|---|---|---|
|  | 46 | 47 |
| Vinac B-100, grams (wt. %) | 374.75 (59.96) | 365.00 (56.96) |
| POEA, grams (wt. %) | 93.75 (15.0) | 156.25 (25.0) |
| NVC, grams (wt. %) | 68.75 (11.0) | 75.00 (12.0) |
| TMPTA, grams (wt. %) | 31.25 (5.0) | — |
| 2-HPA, grams (wt. %) | 25.00 (4.0) | — |
| o-Cl-HABI, grams (wt. %) | 18.75 (3.0) | 25.00 (4.0) |
| MMT, grams (wt. %) | 12.50 (2.0) | 12.50 (2.0) |
| DEAW, grams | 0.188 (0.03) | 0.188 (0.03) |
| BHT, grams (wt. %) | 0.063 (0.01) | 0.063 (0.01) |
| Methanol, grams | 93.8 | 93.8 |
| Dichloromethane, grams | 1781.2 | 1781.2 |
| Thickness, microns | 14.4 | 17.4 |
| *Unprocessed mirrors* | | |
| Reflection Efficiency, % | 28 | 53 |
| fwhm, nm | 5 | 5 |
| $\lambda_{max}$, nm | 479 | 479 |
| Refractive Index Modulation | 0.0062 | 0.0081 |
| *Thermally processed: 100° C., 30 minutes, mirrors between glass and film support* | | |
| Reflection Efficiency, % | 75 | 99 |
| fwhm, nm | 8 | 13 |
| $\lambda_{max}$, nm | 479 | 479 |
| Refractive Index Modulation | 0.0139 | 0.0262 |

EXAMPLE 48

This is a useful composition containing poly(vinylbutyral) binder and TDC plasticizer, but no crosslinking monomer. Reflection holograms recorded in this composition can be thermally processed, without degradation, at temperatures of about 80° C. or less to obtain greater reflection efficiency and bandwidth.

A formulation was prepared containing POEA, NVC, and TDC, as described below and containing 25.4 g PVB (50.93%), 1.0 g o-Cl-HABI (2.0%), 1.0 g MMT (2.0), 0.030 g BHT (0.01%), 20.0 g 2-propanol, and 180 g dichloromethane. The formulation was coated on film support mounted on the back of a front-surface mirror, exposed, and evaluated according to the general procedures given above. Results are presented below.

EXAMPLES 49-51

These are useful compositions containing poly(vinylbutyral) binder and TMPTA crosslinking monomer. Reflection holograms recorded in these compositions can be thermally processed to obtain greater reflection efficiency and bandwidth.

Three formulations were prepared, each containing TMPTA, POEA, and NVC, as described below, and each containing 21.6 g PVB (53.96%), 1.6 g o-Cl-HABI (4.0%), 0.80 g MMT (2.0%), 0.012 g DEAW (0.03%), 0.0040 g BHT (0.01%), 16.0 g ethanol, and 144.0 dichloromethane. the formulations were coated, exposed, and evaluated as in Example 48. Results are presented below.

EXAMPLE 52

This is a useful composition containing poly(vinylbutyral) binder, TMPTA crosslinking monomer, and 4G7 plasticizer. Reflection holograms recorded in this composition can be thermally processed to obtain greater reflection efficiency and bandwidth.

A formulation was prepared containing TMPTA, POEA, NVC, and 4G7, as described below and containing 17.96 g PVB (53.96), 1.33 g o-Cl-HABI (4.0%), 0.67 g MMT (2.0%), 0.010 g DEAW (0.03%), 0.0033 g BHT (0.01%), 13.3 g ethanol, and 119.8 g dichloromethane. The formulation was coated, exposed, and evaluated as in Example 48. Results are presented below.

|  | Example Number | | | | |
|---|---|---|---|---|---|
|  | 48 | 49 | 50 | 51 | 52 |
| TMPTA, grams (wt. %) | — | 2.0 (5) | 2.0 (5) | 2.0 (5) | 1.67 (5) |
| POEA, grams (wt. %) | 5.0 (10) | 4.0 (10) | 10.0 (25) | 14.0 (35) | 3.3 (10) |
| NVC, grams (wt. %) | 12.5 (25) | 10.0 (25) | 4.0 (10) | — | 4.7 (15) |
| 4G7, grams (wt. %) | — | — | — | — | 3.3 (10) |
| Thickness, microns | 24.5 | 23.9 | 26.1 | 24.1 | 26.7 |
| *Unprocessed mirrors* | | | | | |
| Reflection Efficiency, % | 49 | 49 | 48 | 20 | 43 |
| fwhm, nm | 6 | 4 | 5 | 5 | 4 |
| $\lambda_{max}$, nm | 474 | 478 | 476 | 477 | 477 |
| Refractive Index Modulation | 0.0053 | 0.0055 | 0.0050 | 0.0030 | 0.0045 |
| *Thermally processed: 45° C., 12 hours, mirrors on film support* | | | | | |
| Reflection Efficiency, % | 63 | 54 | 51 | 19 | 53 |
| fwhm, nm | 8 | 4 | 5 | 8 | 5 |
| $\lambda_{max}$, nm | 455 | 476 | 474 | 472 | 470 |
| Refractive Index Modulation | 0.0064 | 0.0060 | 0.0052 | 0.0029 | 0.0052 |
| *Thermally processed: 45° C., 12 hours, then 80° C., 30 minutes, mirrors on film support* | | | | | |
| Reflection Efficiency, % | 77 | 63 | 55 | 26 | 63 |
| fwhm, nm | 27 | 7 | 7 | 8 | 5 |
| $\lambda_{max}$, nm | — | 448 | 473 | 472 | 468 |
| Refractive Index Modulation | 0.0079 | 0.0068 | 0.0055 | 0.0035 | 0.0060 |
| *Thermally processed: 150° C., 30 minutes, mirrors on film support* | | | | | |
| Reflection Efficiency, % | 0[a] | 75 | 90 | 58 | 82 |
| fwhm, nm | — | 11 | 9 | 8 | 17 |
| $\lambda_{max}$, nm | — | 424 | 447 | 457 | 440 |
| Refractive Index Modulation | — | 0.0074 | 0.0099 | 0.0060 | 0.0079 |

[a] Coating hazy/cloudy, hologram destroyed

EXAMPLE 53

This is a useful composition coated on aluminized polyethylene terephthalate film.

A formulation identical to Example 34 was prepared and coated on 4-mil aluminized polyethylene terephthalate film using a 6-mil doctor knife. The drier temperature was 40°–50° C. After drying, a cover sheet of silicon release polyethylene terephthalate film was laminated to the coating. A 4×5-inch section of coating was stripped of its cover sheet, mounted on a glass plate, and then exposed and evaluated according to the general procedure described above, except a front surface mirror was not clamped to the plate since the aluminized polyethylene terephthalate film served to reflect the incident radiation. After exposure, the aluminized polyethylene terephthalate film was removed leaving the holographic mirrors mounted on glass. Results before and after thermal processing follow:

|  | Unprocessed Mirror | Processed: 150° C., 90 min., on glass |
|---|---|---|
| Reflection Efficiency, % | 54 | 82 |
| fwhm, nm | 4 | 30 |
| $\lambda_{max}$, nm | 477 | 444 |

EXAMPLE 54

This example illustrates the use of JAW sensitizer.

A composition containing 16.21 gm of Vinac® B-100, 6.0 gm POEA, 1.5 gm NVC, 0.75 gm o-Cl HABI, 0.50 gm MMT, 0.025 gm FC-430, 0.0025 gm BHT, 0.015 gm JAW, 6.0 gm 2-butanone, and 69.0 gm methylene chloride was coated onto a 4-mil (0.1 mm) thick clear film support of polyethylene terephthalate using a Talboy® coater equipped with an 8-mil doctor knife, 12 foot drier set at 40°–50° C., and a laminator station. The coating speed was 8 ft/minute. A cover sheet of 0.9-mil (0.02 mm) polyethylene terephthalate was laminated to the coating as it came out of the drier. Cover sheet and film support were left in place during all subsequent handling, exposure, and processing operations.

A 4×5 inch sample of this material, sandwiched between a glass plate and an aluminized front-surface mirror, was exposed to a collimated 568 nm krypton-ion laser beam orientated perpendicular to the film plane and passing, in order, through the glass plate, film support, coating, and cover sheet and then, after reflecting off the mirror, back through back the cover sheet, coating, film support, and glass plate. The beam had a diameter of about 1.4 cm and an intensity of about 15 mW/cm$^2$. Exposure time was 20 seconds, corresponding to 300 mJ/cm$^2$ total exposure.

As described in the general procedures, the imaged sample containing the holographic mirror was overall exposed to ultraviolet and visible radiation, heated at 100° C. for 15 minutes, and analyzed by recording its transmission spectrum on an Hitachi Perkin-Elmer model 330 spectrophotometer. The maximum reflection efficiency was 87% at 565 nm. The refractive index modulation was 0.0095.

EXAMPLE 55

This example illustrates the use of TBPM monomer.

A composition containing Vinac® B-100 (33.0 gm), Photomer® 4039 (8.5 gm), TBPM (3.95 gm), SR-349 (1.5 gm), o-Cl HABI (1.85 gm), MMT (1.05 gm), FC-430 (0.10 gm), and JAW (0.04 gm) in 200 gm of methylene chloride - methanol (95:5), was coated onto 2 mil (0.05 mm) polyethylene terephthalate film using a Talboy® coater equipped with a 7-mil doctor knife, 12 foot drier set at 40°–50° C., and a laminator station. The coating speed was 8 ft/minutes. A cover sheet of 0.9-mil (0.02 mm) polyethylene terephthalate was laminated to the coating as it came out of the drier.

Film samples were laminated to glass plates as described in the general procedures and index matched with xylene to front surface mirrors. Holographic mirrors were recorded with 514 nm radiation at normal incidence as described in the general procedures. Exposure was for 40 seconds with a 2.5 mW/cm$^2$ beam. Exposed samples were overall exposed as described in the general procedures and heated at 100° C. for 1 hour. Reflection efficiencies were determined as described above. The reflection efficiencies and wavelength of maximum reflection are given in the table.

|  | Reflection Efficiency (%) | $\lambda_{max}$ (nm) | Refractive Index Modulation |
|---|---|---|---|
| After exposure | 47 | 508 | 0.0053 |
| After UV Exposure | 50 | 508 | 0.0056 |
| After Heating | 98 | 508 | 0.0168 |

EXAMPLE 56

This example illustrates the use of PBPM monomer. The procedure of Example 55 was repeated with the exception that BPPM was substituted for TBPM. The reflection efficiencies and wavelength of maximum reflection are given in the table.

|  | Reflection Efficiency (%) | $\lambda_{max}$ (nm) | Refractive Index Modulation |
|---|---|---|---|
| After exposure | 72 | 509 | 0.0087 |
| After UV Exposure | 72 | 507 | 0.0095 |
| After Heating | 99.9 | 508 | 0.0208 |

EXAMPLE 57

Examples 57 through 59 illustrates that increased reflection efficiency can be obtained by preheating the sample.

A composition containing Vinac ® B-100 (65.97%), Photomer ® 4039 (15.05%), NVC (7.95%), SR-349 (5.00%), o-Cl HABI (3.69%), MMT (2.10%), FC-430 (0.195%), and DEAW (0.031%) in methylene chloride - methanol (97:3), was coated onto 4 mil (0.1 mm) polyethylene terephthalate film, dried, and covered with a 1 mil (0.0025 mm) polyethylene terephthalate film cover sheet. Coating thickness was about 1 mil (0.0025 mm). Samples were laminated to glass plates as described in the general procedures. Exposure was as described in the general procedures, except that some of the laminated film samples were preheated prior to exposure.

To preheat the laminated sample, the glass plate was placed on a hot plate, whose surface temperature had been measured beforehand, with the glass in contact with the hot plate and the photopolymer layer and polyethylene terephthalate cover sheet up. The laminated sample was allowed to remain on the hot plate for about 60 seconds. Then it was removed, immediately mounted in the holder of the exposure apparatus, and exposed at 488 nm (intensity about 10 mW/cm$^2$) for the time indicated in the table. The control (i.e., room temperature) samples were exposed without being preheated on the hot plate. The pre-exposure delay time, i.e., the time between removal of a sample from the hot plate and exposure, was approximately 30 seconds. After exposure, the samples were overall exposed to ultraviolet and visible light, as described in the general procedures, and heated at 95° C. for 15 minutes. Reflection efficiencies were determined as described in the general procedures.

| Hot Plate Temperature (°C.) | Exposure Time[a] (sec) | Reflection Efficiency (%) | Refractive Index Modulation |
|---|---|---|---|
| RT[b] | 15 | 23 | 0.0034 |
| 45–50 | 15 | 33 | 0.0043 |
| 60–65 | 15 | 6 | 0.0016 |
| 75–77 | 15 | 2 | 0.0009 |
| RT[b] | 30 | 17 | 0.0029 |
| 45–50[c] | 30 | 24 | 0.0035 |
| 60–65 | 30 | 17 | 0.0028 |
| 75–77 | 30 | 6 | 0.0016 |

[a]Laser exposure time.
[b]Room temperature - about 22° C.
[c]Pre-exposure delay time about 5 seconds.

EXAMPLE 58

Laminated film samples, prepared as described in Example 57, were preheated on a hot plate at the temperatures indicated in the table, exposed, and analyzed as described in Example 57. The control (i.e., room temperature) samples were exposed without being preheated on the hot plate.

|  | Reflection Efficiency (%)[b] | | |
|---|---|---|---|
| Exposure Time (sec)[a] | RT[c] | 30° C. | 45° C. |
| 1 | 0 | ND | 24 |
| 5 | 17 | 27 | 37 |
| 10 | 26 | 29 | 27 |
| 15 | 14 | ND | 37 |

ND = not determined
[a]Laser exposure time.
[b]Room temperature - about 22° C.
[c]Pre-exposure delay time about 5 seconds.

EXAMPLE 59

A composition containing Vinac ® B-100 (65.98%), Photomer ® 4039 (15.02%), NVC (7.99%), SR-349 (5.03%), o-Cl HABI (3.67%), MMT (2.08%), FC-430 (0.195%), and DEAW (0.031%) in methylene chloride - methanol (97:3), was coated onto 4 mil (0.1 mm) polyethylene terephthalate film, dried, and covered with a 1 mil (0.0025 mm) polyethylene terephthalate film cover sheet. Coating thickness was about 1 mil (0.0025 mm). Samples were laminated to glass plates as described in the general procedures Exposure was as described in the general procedures, except that some of the laminated film samples were preheated prior to exposure.

Laminated film samples were preheated on a hot plate at 45° C. Prior to heating, a thin layer of mineral oil was placed on a front surface mirror and the laminated film sample then placed on top of the mirror so that the polyethylene terephthalate film cover sheet was in contact with the mineral oil. This was done for both the control samples and the samples to be heated. The samples to be heated were placed on the hot plate so that the back surface of the mirror was in contact with the hot plate. The front surface of the front surface mirror, the mineral oil layer, the polyethylene terephthalate film cover sheet, the photopolymer layer, and the glass support, in that order, extended up from the surface of the hot plate. The samples were heated for 120 seconds; the pre-exposure delay time was 60 seconds. The samples were exposed and analyzed as described in Example 57. The control (i.e., room temperature) samples were exposed without being preheated on the hot plate.

| Exposure Time (sec)[a] | Reflection Efficiency (%)[b] | |
|---|---|---|
| | RT[c] | 45° C. |
| 1 | 20 (0.0026) | 55 (0.0051) |
| 3 | 12 (0.0019) | 76 (0.0071) |
| 5 | 48 (0.0046) | 77 (0.0072) |
| 10 | 7 (0.0014) | 78 (0.0073) |

[a]Laser exposure time.
[b]Room temperature - about 22° C.
[c]Pre-exposure delay time about 5 seconds.
(Numbers in parenthesis are refractive index modulation values)

EXAMPLE 60

A composition containing Vinac ® B-100 (65.97%), Photomer ® 4039 (20.05%), NVC (7.95%), o-Cl HABI (3.69%), MMT (2.10%), FC-430 (0.195%), DEAW (0.03%), and BHT (0.01%) in methylene chloride - methanol (97:3), was coated as described in Example 57. Samples were laminated to glass plates as described in the general procedures. The glass plate mounted film samples were exposed at 488 nm for 10 seconds (100 mJ) to form holographic mirrors. The exposed samples were heated in an oven at 100° C. for 1 hour.

The polyethylene terephthalate cover sheet was removed and the exposed film samples containing the holographic mirrors immersed in a solution of 1-propanol (80%), methanol (10%), and Photomer ® 4039 (10%) for the times indicated in the table. The samples were removed from the solution and the excess solution blown off. The samples were allowed to air dry for 10 minutes, during which time they were exposed to room light, and then a polyethylene terephthalate cover sheet was laminated to the film surface. The efficiencies, wavelength of maximum reflection, and bandwidth at half-maximum (fwhm) are also given in the table.

| Immersion Time (sec) | Reflection Efficiency (%) | λmax (nm) | fwhm (nm) |
|---|---|---|---|
| 0 | 93 | 489 | 12 |
| 5 | 60 | 613 | 21 |
| 10 | 80 | 623 | 16 |
| 15 | 70 | 630 | 19 |
| 30 | 69 | 653 | 21 |
| 60 | 67 | 691 | 21 |

EXAMPLE 61

The procedure of Example 60 was followed except that the exposed film samples were immersed in a solution of 1-propanol (70%), methanol (15%), and Photomer ® 4039 (15%) for the times indicated in the table. The samples were stored at room temperature and the reflection efficiency periodically measured. The reflection efficiencies, wavelength of maximum reflection, and bandwidth at half-maximum (fwhm) as a function of storage time are also given in the table.

| Immersion Time (sec) | Reflection Efficiency (%) | λmax (nm) | fwhm (nm) |
|---|---|---|---|
| 0 | 94 | 487 | 10 |
| 5 | 58 | 630 | 23 |
| 10 | 66 | 640 | 16 |
| 15 | 64 | 663 | 19 |
| 30 | 66 | 701 | 19 |
| 60 | 49 | 755 | 26 |

EXAMPLE 62

The procedure of Example 60 was followed except that the exposed film samples were immersed in a solution of distilled water (70%), 1-propanol (20%), and TDA (10%) for the times indicated in the table. The efficiencies, wavelength of maximum reflection, and bandwidth at half-maximum (fwhm) are also given in the table.

| Sample Immersed in Monomer Solution for Five Seconds | | | |
|---|---|---|---|
| Storage Time (days) | Reflection Efficiency (%) | $\lambda_{max}$ (nm) | fwhm (nm) |
| 0[a] | 91 | 489 | 10 |
| 0[b] | 67 | 575 | 30 |
| 8 | 72 | 573 | 32 |
| 23 | 66 | 574 | 33 |
| 214 | 70 | 571 | 31 |

[a]Before immersion in monomer solution.
[b]After immersion in monomer solution.

| Sample Immersed in Monomer Solution for Ten Seconds | | | |
|---|---|---|---|
| Storage Time (days) | Reflection Efficiency (%) | $\lambda_{max}$ (nm) | fwhm (nm) |
| 0[a] | 90 | 488 | 11 |
| 0[b] | 61 | 574 | 34 |
| 8 | 67 | 572 | 34 |
| 23 | 62 | 573 | 33 |
| 214 | 70 | 568 | 34 |

[a]Before immersion in monomer solution.
[b]After immersion in monomer solution.

| Sample Immersed in Monomer Solution for Twenty Seconds | | | |
|---|---|---|---|
| Storage Time (days) | Reflection Efficiency (%) | $\lambda_{max}$ (nm) | fwhm (nm) |
| 0[a] | 92 | 488 | 10 |
| 0[b] | 77 | 605 | 24 |
| 8 | 75 | 606 | 22 |
| 23 | 79 | 608 | 23 |
| 214 | 76 | 602 | 20 |

[a]Before immersion in monomer solution.
[b]After immersion in monomer solution.

| Sample Immersed in Monomer Solution for Thirty Seconds | | | |
|---|---|---|---|
| Storage Time (days) | Reflection Efficiency (%) | $\lambda_{max}$ (nm) | fwhm (nm) |
| 0[a] | 94 | 489 | 12 |
| 0 | 83 | 624 | 19 |
| 8 | 86 | 625 | 18 |
| 23 | 82 | 626 | 21 |
| 214 | 83 | 622 | 17 |

[a]Before immersion in monomer solution.
[b]After immersion in monomer solution.

EXAMPLE 63

The procedure of Example 60 was followed except that the exposed film samples were immersed in a solution of distilled water (66.7%), 1-propanol (23.8%), and TDA (9.5%) for the times indicated in the table. The efficiencies, wavelength of maximum reflection, and bandwidth at half-maximum (fwhm) are given in the table.

Sample Immersed in Monomer Solution for Thirty Seconds

| Storage Time (days) | Reflection Efficiency (%) | $\lambda_{max}$ (nm) | fwhm (nm) |
|---|---|---|---|
| 0[a] | 92 | 488 | 9 |
| 0[b] | 66 | 587 | 43 |
| 1 | 78 | 581 | 29 |
| 8 | 74 | 574 | 28 |
| 23 | 82 | 575 | 24 |
| 214 | 84 | 570 | 20 |

[a] Before immersion in monomer solution.
[b] After immersion in monomer solution.

EXAMPLE 64

The procedure of Example 63 was followed except that two exposed samples which had been exposed for the same amount of time and which had been immersed for the same amount of time, were laminated together. The efficiencies, wavelength of maximum reflection, and bandwidth at half-maximum (fwhm) for the mirrors formed by laminating together the two exposed film samples are given in the table.

Sample Immersed in Monomer Solution for Ten Seconds

| Storage Time (days) | Reflection Efficiency (%) | $\lambda_{max}$ (nm) | fwhm (nm) |
|---|---|---|---|
| 0[a] | 98 | 488 | 9 |
| 0[b] | 66 | 596 | 72 |
| 1 | — | 83 | 571 | 28 |
| 8 | 82 | 568 | 26 |
| 23 | 98 | 565 | 19 |
| 214 | 98 | 562 | 16 |

[a] Before immersion in monomer solution.
[b] After immersion in monomer solution.

Sample Immersed in Monomer Solution for Fifteen Seconds

| Storage Time (days) | Reflection Efficiency (%) | $\lambda_{max}$ (nm) | fwhm (nm) |
|---|---|---|---|
| 0[a] | 97 | 489 | 11 |
| 0[b] | 68 | 584 | 50 |
| 1 | 85 | 582 | 37 |
| 8 | 82 | 580 | 34 |
| 23 | 95 | 580 | 27 |
| 214 | 94 | 576 | 24 |

[a] Before immersion in monomer solution.
[b] After immersion in monomer solution.

Having described the invention, we now claim the following and their equivalents:

1. An Optical Combiner for a Head-Up Display comprising a transparent substrate that bears a transparent polymeric film containing a mirror formed by a reflection hologram, said film having a refractive index modulation greater than approximately 0.001 and being formed by exposing to coherent light a composition consisting essentially of:
   (a) approximately 25 to 90% of a polymeric binder selected from the group consisting of polyvinyl acetate, polyvinyl butyral, polyvinyl acetal, polyvinyl formal, interpolymers containing major segments thereof and mixtures thereof;
   (b) approximately 5 to 60% of an ethylenically unsaturated liquid monomer containing at least one phenyl, biphenyl, phenoxy, naphthyl, naphthyloxy, heteroaromatic group containing up to three aromatic rings, chlorine or bromine moiety;
   (c) approximately 0 to 25% of a plasticizer; and
   (d) approximately 0.1 to 10% of a photoinitiator system activatable by actinic radiation
   wherein said percentages are weight percentages based on total film weight.

2. The Combiner of claim 1 wherein the hologram has a reflection efficiency of at least approximately 15%.

3. The Combiner of claim 2 wherein the transparent substrate is selected from the group consisting of glass, quartz, polymethylmethacrylate, polycarbonate, and polystyrene.

4. The Combiner of claim 2 which is a lamination of, in order, a glass sheet, said transparent polymeric film containing said reflection hologram, a second transparent polymeric film, and a second glass sheet.

5. The Combiner of claim 1 wherein a solid monomer is also present with said liquid monomer and the hologram has a refractive index modulation greater than approximately 0.005.

6. The Combiner of claim 1 or 5 wherein the ethylenically unsaturated monomer is a liquid selected from the group consisting of phenoxyethyl acrylate, phenol ethoxylate monoacrylate, the di(2-acryloxyethyl) ether of bisphenol-A, ethoxylated bisphenol-A diacrylate, 2-(1-naphthyloxy) ethyl acrylate, and ortho-biphenyl methacrylate, mixtures thereof.

7. The Combiner of claim 5 wherein the ethylenically unsaturated monomer is a mixture of a solid monomer selected from the group consisting of N-vinyl carbazole, 3,6-dibromo-9-vinyl carbazole, 2,4,6-tribromophenyl acrylate or methacrylate, pentachlorophenyl acrylate or methacrylate, 2-vinyl naphthalene, 2-naphthyl acrylate or methacrylate, 2-(2-naphthyloxy)ethyl acrylate or methacrylate, para-biphenyl methacrylate, t-butylphenyl methacrylate, di-(2-acryloxyethyl)ether of tetrabromo-bisphenol-A and mixtures thereof; and a liquid monomer selected from the group consisting of phenoxyethyl acrylate, phenol ethoxylate acrylate, the di(2-acryloxyethyl ether) of bisphenol-A, ortho-biphenyl methacrylate, ethoxylated bisphenol-A diacrylate, 2-(1-naphthyloxy)ethyl acrylate, and mixtures thereof.

8. The Combiner of claim 1 or 5 containing a plasticizer selected from the group consisting of tris(2-ethylhexyl)phosphate, glyceryl tributyrate, and a compound having the general formula:

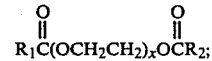

$$R_1C(OCH_2CH_2)_xOCR_2;$$

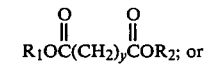

$$R_1OC(CH_2)_yCOR_2; \text{ or}$$

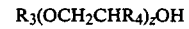

$$R_3(OCH_2CHR_4)_zOH$$

wherein $R_1$ and $R_2$ each is an alkyl group of 1 to 10 carbon atoms, $R_3$ is H or an alkyl group of 8 to 16 carbon atoms, $R_4$ is H or $CH_3$, x is 1–4, y is 2–20, and z is 1–20.

9. The Combiner of claim 8 wherein the plasticizer is selected from the group consisting of triethylene glycol dicaprylate, triethylene glycol bis(2-ethylhexanoate), diethyl adipate, dibutyl adipate, tetraethylene glycol diheptanoate, dibutyl suberate, diethyl sebacate, tris(2-ethylhexyl)phosphate, and glyceryl tributyrate.

10. The Combiner of claim 5 wherein the components in said film are present in the following approximate weight ranges: binder, 45 to 75%; monomer, 15 to 50%; and plasticizer, 0 to 15%.

11. The Combiner of claim 10 wherein the hologram has a refractive index modulation greater than approximately 0.010.

12. The Combiner of claim 5 wherein the transparent substrate is selected from the group consisting of glass, quartz, polymethylmethacrylate, polycarbonate, and polystyrene.

13. The Combiner of claim 5 which is a lamination of, in order, a glass sheet, said transparent polymeric film containing said hologram, a second transparent polymeric film, and a second glass sheet.

14. The Combiner of claim 5 wherein the mirror hologram has a refractive index modulation greater than approximately 0.010.

15. The Combiner of claim 5 wherein the film has a thickness in the range of approximately 1 to 100 micrometers.

16. A method of forming an Optical Combiner for a Head-Up Display consisting essentially of:
(a) mounting a transparent support onto one side of a transparent polymeric film consisting essentially of:
 (1) approximately 25 to 90% of a polymeric binder selected from the group consisting of polyvinyl acetate, polyvinyl butyral, polyvinyl acetal, polyvinyl formal, interpolymers containing major segments thereof, and mixtures thereof;
 (2) approximately 5 to 60% of an ethylenically unsaturated liquid monomer containing at least one phenyl, biphenyl, phenoxy, naphthyl, naphthyloxy, heteroaromatic group containing up to three aromatic rings, chlorine or bromine moiety;
 (3) approximately 0 to 25% of a plasticizer; and
 (4) approximately 0.1 to 10% of a photoinitiator system activatable by the actinic radiation, wherein said percentages are weight percentages based on total film weight;
(b) exposing the mounted film to coherent light in a manner that forms a reflection hologram in said film; and
(c) laminating the imaged film to a permanent transparent substrate,
said Combiner having an imaged film that has a refractive index modulation of at least 0.001.

17. The process of claim 16 wherein the mounted film is exposed to an object beam and a reference beam of coherent light that enter the transparent film from opposite sides to create interference fringes forming a holographic mirror.

18. The process of claim 16 wherein the interference fringes are substantially coplanar with the film plane.

19. The process of claim 16 wherein the plane of the interference fringes are at an acute angle with the film plane.

20. The process of claim 16 including the step of removing the transparent support after the imaged film is laminated to the permanent transparent substrate.

21. The process of claim 16 wherein the polymeric film also contains a solid monomer with said liquid monomer and, after exposure to form a reflection hologram, has a refractive index modulation greater than approximately 0.005.

22. The process of claim 16 or 21 wherein the mounted film of step (a) is heated to approximately 30° to 50° C. immediately prior to being exposed to coherent light during step (b).

23. The process of claim 16 or 21 wherein, after step (b), the imaged film is treated with an organic liquid to increase reflection efficiency.

24. The process of claim 23 wherein the organic liquid is selected from the group consisting of glycol alkyl ethers, alcohols, ketones, and esters.

25. The process of claim 16 or 21 wherein, after step (b), the imaged film is heated to a temperature above 50° C. for a sufficient time to enhance reflection efficiency.

26. The process of claim 25 wherein the imaged film is heated to a temperature in the range of approximately 80° to 160° C.

27. The process of claim 25 or 26 wherein said heating occurs during step (c) lamination.

28. The process of claim 27 wherein the resulting Combiner has a refractive index modulation of at least 0.005.

29. The process of claim 16 or 21 wherein, after step (b), the imaged film is treated with liquid monomer solution that stabilizes reflection efficiency, said treatment comprising exposing the imaged film surface to liquid monomer that is absorbed by the film, drying the film, and polymerizing the absorbed monomer by exposure to actinic radiation.

30. The process of claim 29 wherein said treatment with liquid monomer is performed after the film is heated to a temperature above 50° C. for a sufficient time to enhance reflection efficiency.

* * * * *